(12) United States Patent
Sato et al.

(10) Patent No.: US 12,101,917 B2
(45) Date of Patent: Sep. 24, 2024

(54) VEHICLE DRIVE UNIT

(71) Applicants: Mazda Motor Corporation, Hiroshima (JP); Rohm Co., Ltd., Kyoto (JP)

(72) Inventors: Takayuki Sato, Aki-gun (JP); Akihiro Noda, Aki-gun (JP); Masashi Hayashiguchi, Kyoto (JP)

(73) Assignees: MAZDA MOTOR CORPORATION, Hiroshima (JP); ROHM CO., LTD., Kyoto (JP)

( * ) Notice: Subject to any disclaimer, the term of this patent is extended or adjusted under 35 U.S.C. 154(b) by 212 days.

(21) Appl. No.: 17/970,498

(22) Filed: Oct. 20, 2022

(65) Prior Publication Data
US 2023/0140022 A1 May 4, 2023

(30) Foreign Application Priority Data
Oct. 29, 2021 (JP) .................................. 2021-178192

(51) Int. Cl.
| | |
|---|---|
| *H05K 7/20* | (2006.01) |
| *B60L 50/51* | (2019.01) |
| *H02M 7/00* | (2006.01) |
| *H02M 7/537* | (2006.01) |

(52) U.S. Cl.
CPC .......... *H05K 7/20927* (2013.01); *B60L 50/51* (2019.02); *H02M 7/003* (2013.01); *H02M 7/537* (2013.01); *B60L 2210/40* (2013.01); *B60L 2220/50* (2013.01)

(58) Field of Classification Search
CPC ...................................................... H05K 7/20
See application file for complete search history.

(56) References Cited

U.S. PATENT DOCUMENTS

2017/0158042 A1* 6/2017 Miyazawa ................ B60L 1/02
2018/0248449 A1* 8/2018 Iwanaga ................ H02K 29/08

FOREIGN PATENT DOCUMENTS

| JP | 2004201462 A | 7/2004 |
|---|---|---|
| JP | 2007116840 A | 5/2007 |
| JP | 2014043122 A | 3/2014 |
| JP | 2021112011 A | 8/2021 |

* cited by examiner

*Primary Examiner* — Jerry Wu
(74) *Attorney, Agent, or Firm* — Alleman Hall & Tuttle LLP

(57) ABSTRACT

In a vehicle drive unit, a motor and an inverter are disposed adjacent in an axial direction of the motor. A smoothing capacitor and each power module are connected by a busbar. Each power module has a flat shape having a wide width, and has a first cooling surface facing the motor. The first cooling surface of each power module is placed on a placement surface orthogonal to the axial direction. The plate-shaped busbar has a second cooling surface facing the motor. The busbar is connected to the smoothing capacitor and each power module, and is formed with a wide width so as to extend along a direction in which each power module is disposed side by side. The second cooling surface is placed on the placement surface. A cooling portion facing the first and second cooling surfaces is provided closer to the motor than the placement surface.

20 Claims, 16 Drawing Sheets

VEHICLE DRIVE UNIT

BACKGROUND OF THE INVENTION

1. Field of the Invention

The present disclosure relates to a vehicle drive unit including a motor and an inverter.

2. Description of the Related Art

In recent years, cars that travel by using electricity, such as hybrid cars and electric cars, have considerably come into wide use. Cars of such a type include a drive motor and a battery. A drive unit including a motor and a battery drives the motor by converting direct current from the battery to alternating current by an inverter.

The inverter has a smoothing capacitor and a power module including a switching element. Since the inverter handles high electric power, a high voltage is applied and a large current flows. Therefore, the heat generation amount at the time of operation is large, and thus cooling is required. A high surge voltage is also generated. Therefore, individual electronic components of the inverter become large, and also tend to be heavy. Consequently, the inverter of the related art is a factor that prevents fuel costs and electricity costs from being reduced.

In order to reduce a power transmission distance, the inverter is ordinarily disposed near a motor. However, in the case of a car, there are many devices to be installed and thus a space in which the inverter can be disposed is limited. It is also necessary to consider the balance of a car body. Therefore, it is difficult to adequately dispose a large, heavy inverter in a car.

Among structural components of the inverter, in particular, the power module has a high heat generation amount, and thus cooling is required. An inverter disclosed in Japanese Unexamined Patent Application Publication No. 2021-112011 includes a cooling structure of a power module. In the cooling structure, a large portion excluding a lower end portion of the vertically long power module, that is, an upper surface and a side surface are inserted into a cooling liquid path in which a cooling liquid flows and are immersed in the cooling liquid.

Since the power module according to Japanese Unexamined Patent Application Publication No. 2021-112011 is vertically long, the area of the upper surface and the area of a lower surface are relatively smaller than the area of the side surface. Therefore, not only the upper surface or the lower surface of the power module, but also the side surface needs to be inserted into the cooling path. Therefore, since the cooling structure of the inverter becomes large, the entire drive unit including a motor and an inverter also becomes large.

SUMMARY OF THE INVENTION

The present disclosure has been made in view of such points, and it is an object of the present disclosure to, while sufficiently cooling a power module, reduce the size of a drive unit including a motor and an inverter.

A vehicle drive unit according to the present disclosure includes a motor and an inverter disposed adjacent to each other in an axial direction of the motor, the inverter having a smoothing capacitor and a plurality of power modules. In the vehicle drive unit, the smoothing capacitor and each power module are connected to each other by a busbar. Each power module has a flat shape having a width greater than a thickness thereof, and has a first cooling surface disposed on one surface side and facing the motor, the first cooling surface of each power module is placed side by side on a placement surface orthogonal to the axial direction, the busbar has a plate shape and has a second cooling surface disposed on the one surface side and facing the motor, one end portion of the busbar is connected to the smoothing capacitor, the other end portion of the busbar is connected to each power module, the busbar is formed with a width greater than a thickness thereof so as to extend widthwise along a direction in which each power module is disposed side by side, the second cooling surface is placed on the placement surface, and a cooling portion facing the first cooling surface and the second cooling surface is provided closer to the motor than the placement surface.

According to such a structure, since the first cooling surface having a large area of each flat power module having a wide width faces the cooling portion, the cooling area of cooling each power module by the cooling portion can be increased. Therefore, even if only one surface (first cooling surface) of each power module is cooled by the cooling portion, a sufficient cooling ability can be ensured.

The busbar can be formed with a wide width by causing the busbar to extend widthwise along a direction in which each power module is disposed side by side. Since the large area of the second cooling surface of the wide, plate-shaped busbar faces the cooling portion, the heat-dissipation area of dissipating heat to the cooling portion from the busbar can be increased. Therefore, even if the cooling ability of cooling each power module by the cooling portion is insufficient, the insufficient cooling ability can be compensated.

Since the first cooling surface of each power module is placed side by side on the placement surface orthogonal to the axial direction of the motor, the axial-direction length of the inverter can be reduced. Since the cooling portion needs to be provided only on one surface side of each power module, the inverter can be reduced in size compared with when the cooling portion is provided on two surface sides of each power module.

Accordingly, while sufficiently cooling each power module, the size of the drive unit including the motor and the inverter can be reduced.

In one embodiment, the cooling portion includes a cooling path in which a cooling medium flows.

According to such a structure, the cooling ability of cooling each power module by the cooling portion can be increased by causing a cooling medium to flow in the cooling path.

In one embodiment, each power module includes a silicon carbide metal-oxide-semiconductor field-effect transistor (SiC-MOSFET).

According to such a structure, since the size of a SiC-MOSFET chip of each power module is small, the size of a heat transfer block (for example, a copper block) that is placed on each SiC-MOSFET chip can also be reduced. If each power module is to be effectively cooled at two surfaces thereof, expensive ceramic substrates (for example, SiN) need to be disposed on two surface sides of the SiC-MOSFET chips. Therefore, cooling one surface of each power module and increasing the effectiveness of cooling the one surface is advantageous in terms of costs than cooling two surfaces of each power module.

In one embodiment, the smoothing capacitor has a third cooling surface disposed on the one surface side and facing the motor, the third cooling surface is placed on the placement surface, and the cooling portion also faces the third cooling surface.

According to such a structure, the smoothing capacitor, together with the power modules, can be cooled by the cooling portion.

In one embodiment, each power module is disposed closer to an outer peripheral side than the smoothing capacitor and the busbar is formed so that the width thereof extends along a peripheral direction of the motor.

According to such a structure, the busbar can be easily formed with a wide width.

In one embodiment, an inductance of the busbar is a function of a length extending from the one end portion to the other end portion of the busbar, the function has a minimum value so that the inductance becomes the same at a first length and a second length that differ from each other, the smoothing capacitor and each power module are connected to each other by two of the busbars, the two busbars being a negative-electrode-side busbar and a positive-electrode-side busbar, a length of one of the negative-electrode-side busbar and the positive-electrode-side busbar is the first length, a length of the other of the negative-electrode-side busbar and the positive-electrode-side busbar is the second length, and at least one of the negative-electrode-side busbar and the positive-electrode-side busbar has the second cooling surface.

According to such a structure, even though the length of the negative-electrode-side busbar and the length of the positive-electrode-side busbar differ from each other, the inductance of the negative-electrode-side busbar and the length of the positive-electrode-side busbar can be equalized.

According to the present disclosure, while sufficiently cooling each power module, the drive unit including a motor and an inverter can be reduced in size.

DESCRIPTION OF THE PREFERRED EMBODIMENTS

Embodiments of the present disclosure are described in detail below based on the drawings. The description of preferable embodiments below merely substantially gives exemplifications, and is not intended at all to limit the present disclosure, applicable matters thereof, or use thereof.

First Embodiment

Vehicle Structure

Figure 1:
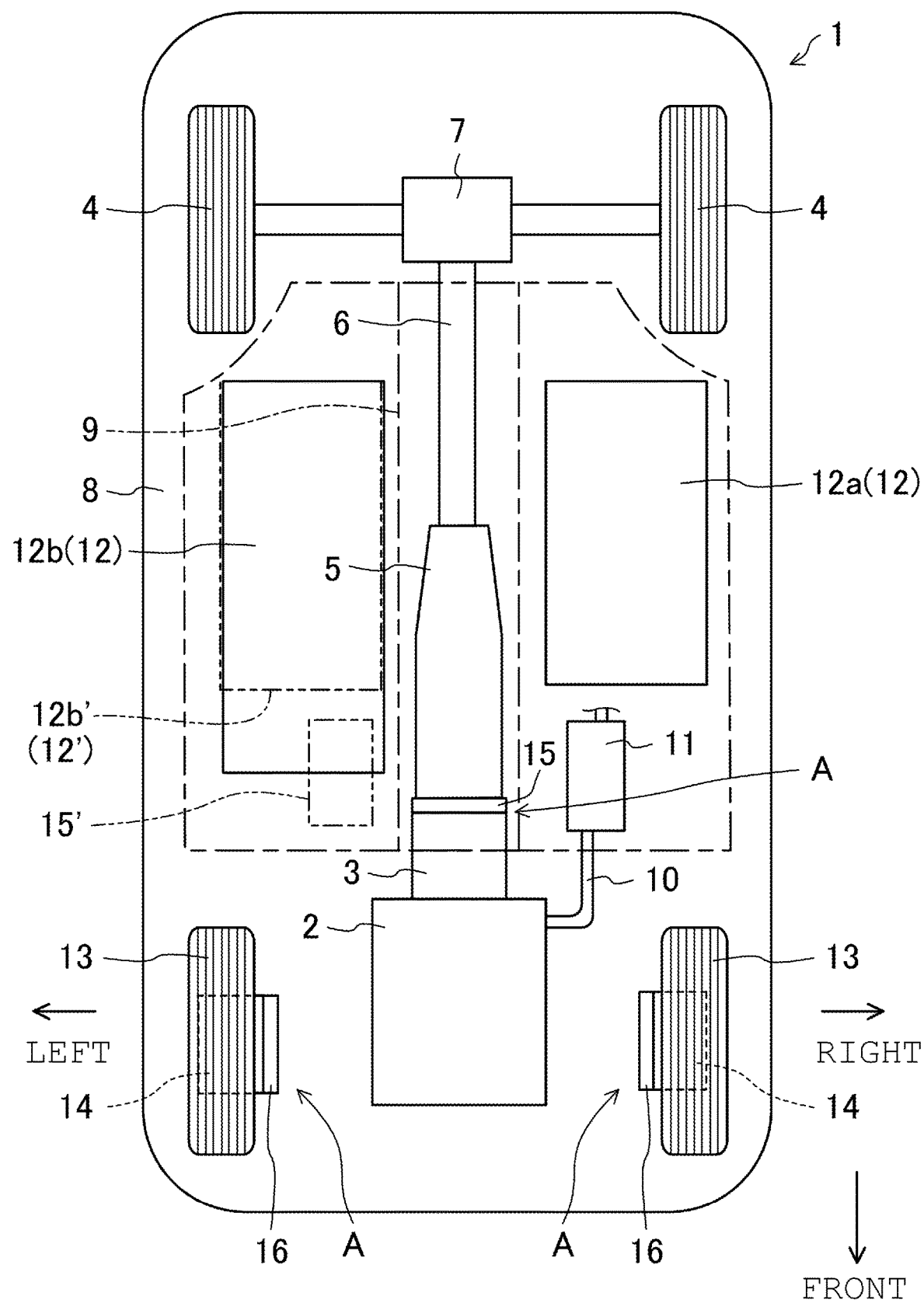
FIG. 1 is a schematic structural view of a vehicle system including a drive unit according to a first embodiment.

FIG. 1 shows a vehicle 1 including drive units A according to a first embodiment when seen from below the vehicle. In the vehicle 1, power from at least one of an engine 2 and a drive motor 3 disposed at the front of the vehicle is transmitted to rear wheels 4 disposed at the rear of the vehicle. That is, the vehicle 1 is a hybrid vehicle of a front engine/rear drive (FR) type.

As shown in FIG. 1, the vehicle 1 includes the engine 2, a transmission 5 that is connected to the engine 2, the drive motor 3 that is disposed between the engine 2 and the transmission 5, a propeller shaft 6 that is connected to the transmission 5 and that transmits power from the engine 2 and the drive motor 3 to the rear wheels, and a differential 7 that is connected to the propeller shaft 6 and that transmits power from the engine 2 and the drive motor 3 to the left and right rear wheels 4.

The propeller shaft 6 extends below a floor panel 8 in a vehicle front-rear direction. A tunnel portion 9 is provided on a central side in a vehicle width direction of the floor panel 8. The propeller shaft 6 is disposed on an inner side of the tunnel portion 9.

The vehicle 1 includes an exhaust pipe 10 extending in the vehicle front-rear direction from the engine 2. A catalytic device 11 is disposed on an upstream side of the exhaust pipe 10. Although not shown, a silencer is disposed on a downstream side of the exhaust pipe 10.

The vehicle 1 includes a fuel tank (not shown) that stores fuel to be supplied to the engine 2, and a battery 12 that stores electric power to be supplied to the motor 3. The drive motor 3 transmits power to the rear wheels 4, and is rotationally driven by the propeller shaft 6 and generates regenerative power when the speed of the vehicle is reduced to supply the generated electric power to the battery 12. The battery 12 includes a first battery unit 12a and a second battery unit 12b, which are disposed one on each side in the vehicle width direction. The second battery unit 12b is longer than the first battery unit 12a in the vehicle front-rear direction. Each of the battery units 12a and 12b includes a plurality of battery cells. The battery cells are, for example, lithium-ion batteries.

An in-wheel motor 14 is connected to each of left and right front wheels 13. Each in-wheel motor 14 functions as an assist motor that generates power and transmits the power to the front wheels 13 when the vehicle 1 is started. Each in-wheel motor 14 functions as a regenerative brake that generates electric power when the speed of the vehicle is reduced. Similarly to the drive motor 3, each in-wheel motor 14 has electric power supplied thereto from the battery 12.

As shown in FIG. 1, an inverter 15 is interposed between the drive motor 3 and the transmission 5. The drive motor 3 and the inverter 15 are disposed adjacent to each other in an axial direction of the drive motor 3 (vehicle front-rear direction). Inverters 16 are disposed on inner sides of the respective in-wheel motors 14 in the vehicle width direction. The in-wheel motors 14 and the respective inverters 16 are disposed adjacent to each other in an axial direction of each in-wheel motor 14 (vehicle width direction). The drive motor 3 and the inverter 15 constitute the drive unit A. Similarly, the in-wheel motors 14 and the respective inverters 16 constitute the drive units A.

The inverter 15 and the inverters 16 each convert direct-current electric power stored in the battery 12 into alternating-current electric power and supply the converted electric power to a corresponding one of the motor 3 and the motors 14, and each convert the alternating-current electric power generated at the corresponding one of the motor 3 and the motors 14 into direct-current electric power to charge the battery when the speed of the vehicle is reduced.

Drive Units

Figure 2:
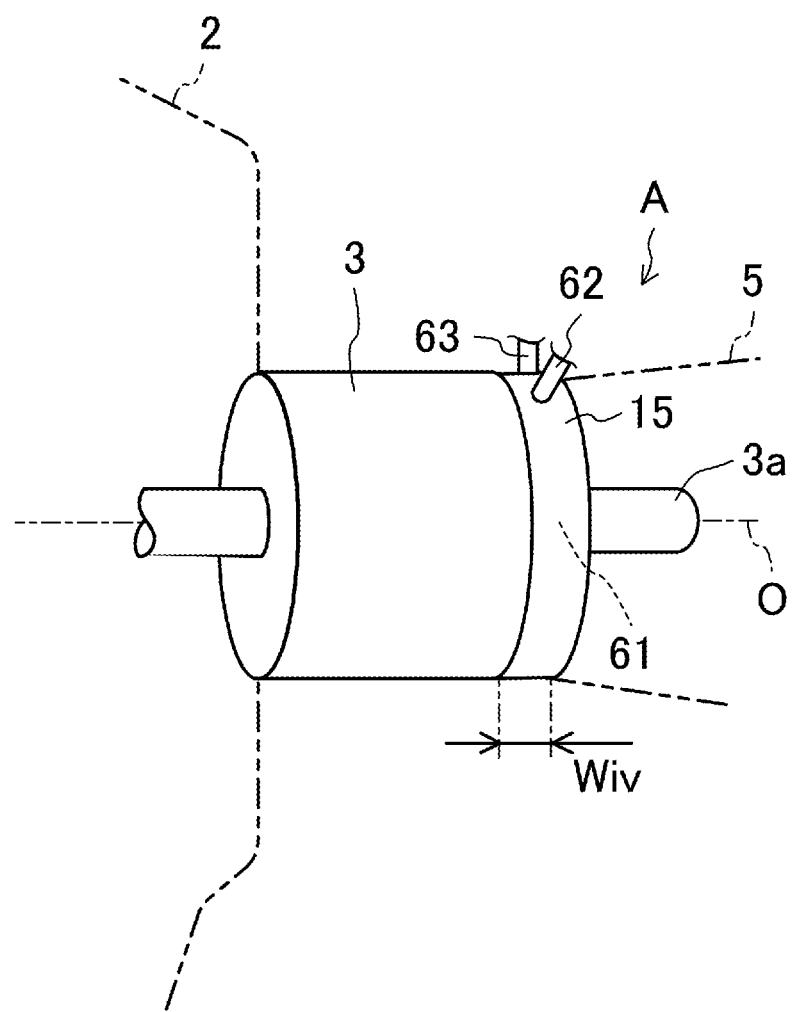
FIG. 2 is a perspective view of the drive unit including a motor and an inverter.

The drive units A of the vehicle 1 are described by taking as an example, the drive unit A including the drive motor 3 and the inverter 15. FIG. 2 is a perspective view of the drive unit A. As described above, the drive unit A includes the motor 3 and the inverter 15. The motor 3 and the inverter 15 are disposed adjacent and coaxially to each other in the axial direction of the motor 3. Specifically, a center axis O of the motor 3 and a center axis O of the inverter 15 coincide with each other. The motor 3 (specifically, a casing of the motor 3) is formed with a cylindrical shape. The inverter 15 (specifically, a casing of the inverter 15) is formed with a cylindrical shape corresponding to that of the motor 3. A rotation shaft 3a of the motor 3 extends through the inverter 15 in the axial direction. A thickness Wiv of the inverter 15 is small, and is, for example, 50 mm or less (preferably, 30 mm or less). A cooling path 61 (described later) is provided inside the inverter 15. A cooling inlet pipe 62 and a cooling outlet pipe 63 that communicate with the cooling path 61 are connected to an upper portion of the inverter.

Figure 3:
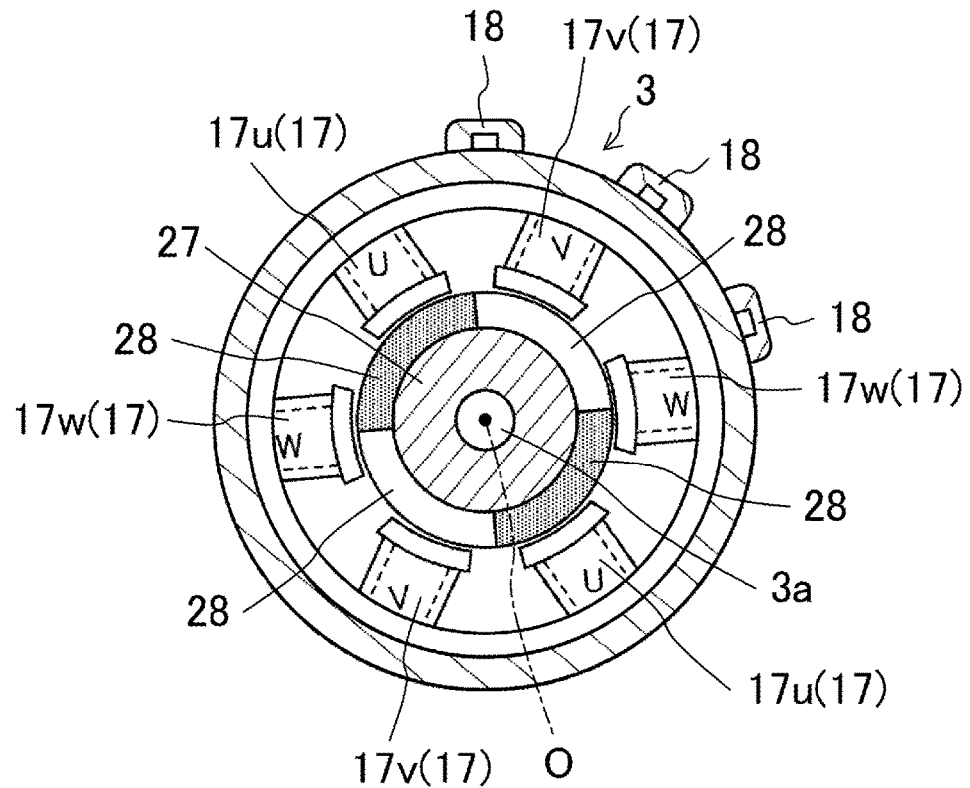
FIG. 3 is a cross sectional view of the motor when seen from the inverter.

FIG. 3 is a cross sectional view of the motor 3 when seen from the inverter 15. The motor 3 has coils 17. Specifically, U-phase coils 17u, V-phase coils 17v, and W-phase coils 17w are wound in a concentrated manner on a stator of the motor 3. The U-phase coils 17u are disposed at two locations so as to oppose each other in a radial direction of the motor 3. Similarly, the V-phase coils 17v are disposed at two locations so as to oppose each other in the radial direction of the motor 3. Similarly, the W-phase coils 17w are disposed at two locations so as to oppose each other in the radial direction of the motor 3.

Three motor-side terminal blocks 18 are provided at an outer peripheral portion of the motor 3. The three motor-side terminal blocks 18 correspond to the U-phase coils 17u, the V-phase coils 17v, and the W-phase coils 17w. Lead wires (not shown) extend from the U-phase coils 17u disposed at the two locations. The two lead wires are bundled into one lead wire and the bundle is then connected to the motor-side terminal block 18. This also applies to the V-phase coils 17v and the W-phase coils 17w. As a rotor, an iron core 27 and a permanent magnet 28 having a N pole and a S pole are fixed to the rotation shaft 3a.

Figure 4:
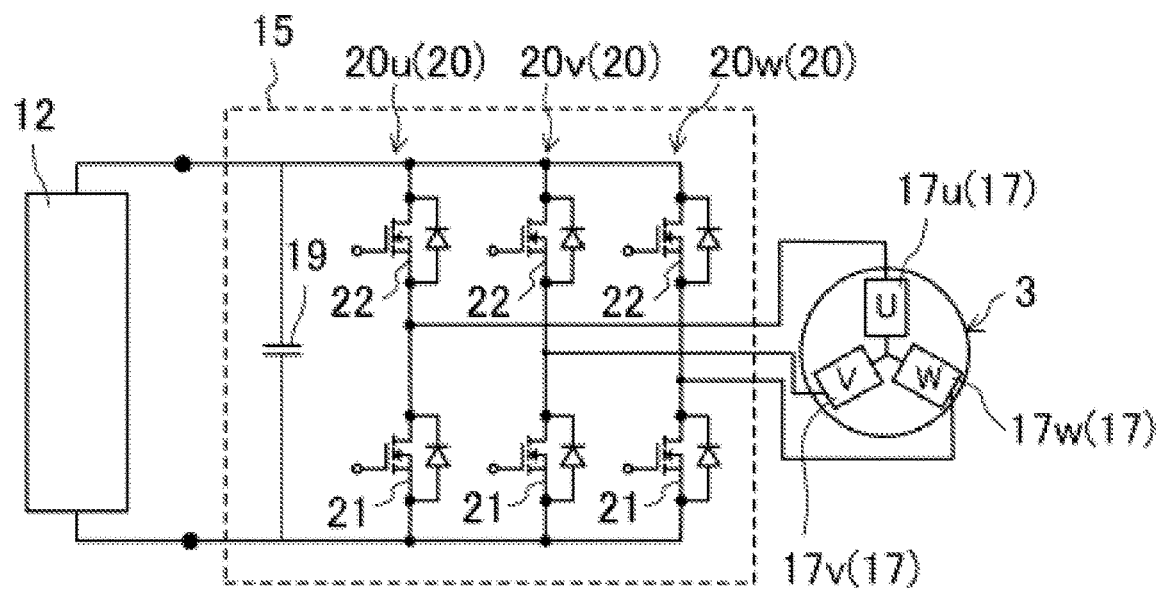
FIG. 4 is a circuit diagram of the inverter.

FIG. 4 is a circuit diagram of the inverter 15. The inverter 15 includes a smoothing capacitor 19 and a plurality of power modules 20. The smoothing capacitor 19 smoothens a voltage that is applied to the power modules 20. The plurality of power modules 20 constitute an inverter circuit, and convert direct-current voltage into an alternating-current voltage.

The plurality of power modules 20 include a U-phase power module 20u, a V-phase power module 20v, and a W-phase power module 20w. The U-phase power module 20u corresponds to the U-phase coils 17u of the motor 3. The V-phase power module 20v corresponds to the V-phase coils 17v of the motor 3. The W-phase power module 20w corresponds to the W-phase coils 17w of the motor 3.

Each power module 20 includes two arm elements, that is, a lower arm element 21 and an upper arm element 22, serving as switching elements. In each phase power module 20, when one of the lower arm element 21 and the upper arm element 22 is opened, the other of the lower arm element 21 and the upper arm element 22 is closed. Therefore, a three-phase alternating current is supplied to the motor 3.

Figure 5:
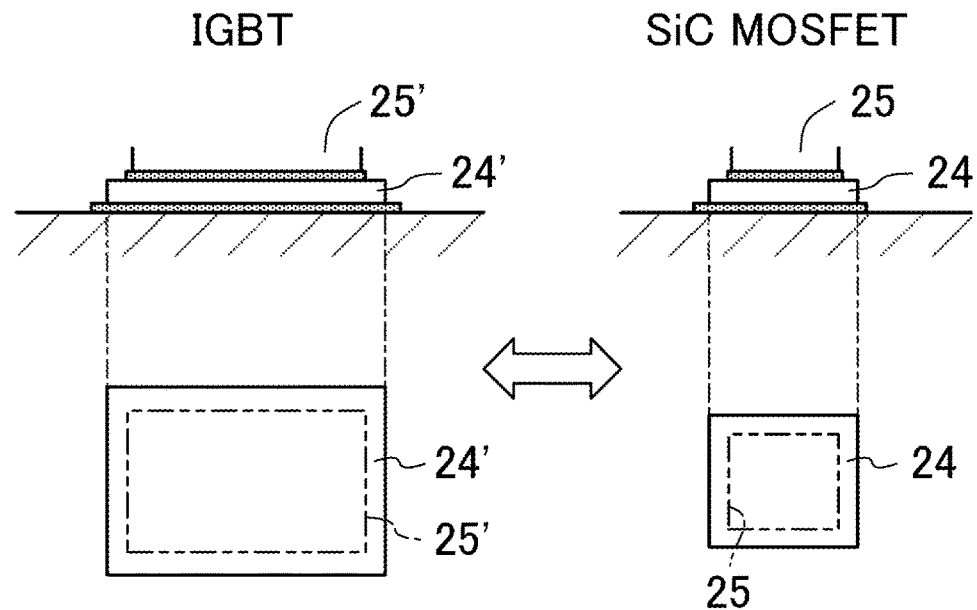
FIG. 5 shows a comparison between a SiC-MOSFET and an IGBT.

Here, each power module 20 includes a SiC-MOSFET. FIG. 5 shows a comparison between a SiC-MOSFET and an IGBT. The SiC-MOSFET is a MOSFET (metal-oxide-semiconductor field-effect transistor) including silicon carbide (SiC), and constitutes a chip 24 including the lower arm element 21 and the upper arm element 22 and, for example, other control elements. A lower surface of the chip 24 is soldered and fixed to a silicon substrate. A copper block 25, serving as a heat transfer block, is soldered and fixed to an upper surface of the chip 24. This also applies to the IGBT (insulated gate bipolar transistor).

As shown in FIG. 5, a surface area of the chip 24 constituted by the SiC-MOSFET is smaller than a surface area of a chip 24' constituted by the IGBT. Therefore, the size of the copper block 25 disposed on an upper side of the SiC-MOSFET (chip) 24 is smaller than the size of a copper block 25' disposed on an upper side of the IGBT (chip) 24'. The SiC-MOSFET has better heat resistance than the IGBT.

Figure 6:
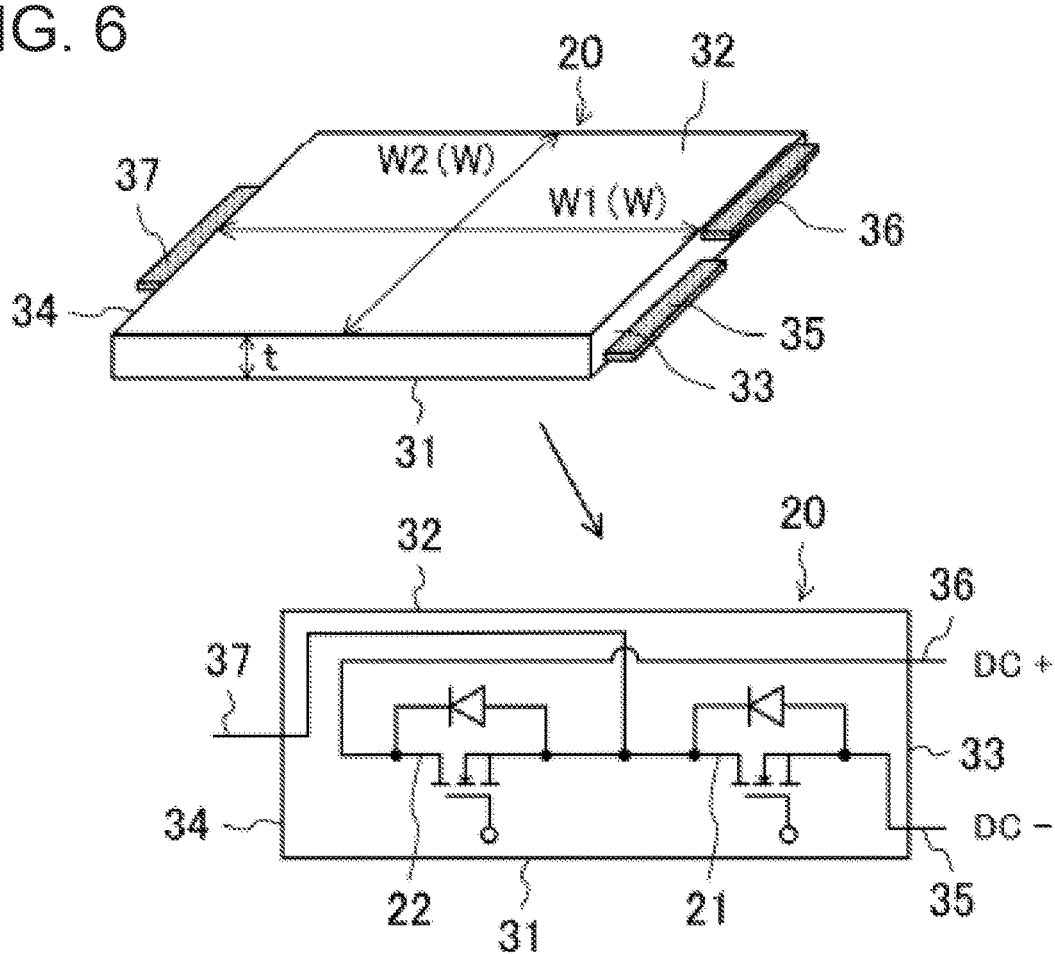
FIG. 6 is a perspective view and a circuit diagram of a detailed structure of a power module.

FIG. 6 is a perspective view and a circuit diagram of a detailed structure of a power module 20. Each power module 20 has a flat shape having a wide width. Specifically, each power module 20 is longer in a width direction W than in a thickness direction t. Each power module 20 has a substantially parallelepiped shape. The width direction W includes a first width direction W1 and a second width direction W2 orthogonal to each other. Hereunder, one side of the power module 20 in the thickness direction may be the lower side and an opposite side of the power module 20 in the thickness direction may be the upper side.

The power module 20 has a lower surface 31, serving as a first cooling surface, on the lower side (one surface side, the one side in the thickness direction). The power module 20 has an upper surface 32 on the upper side. The power module 20 has a first end surface 33 on one side in the first width direction W1. The power module 20 has a second end surface 34 on an opposite side in the first width direction W1.

A negative-electrode-side input terminal 35 is connected to a lower side of the first end surface 33 and on one side in the second width direction W2. A positive-electrode-side input terminal 36 is connected to an upper side of the first end surface 33 and on an opposite side in the second width direction W2. The negative-electrode-side input terminal 35 and the positive-electrode-side input terminal 36 are disposed apart from each other in an up-down direction (thickness direction). An output terminal 37 is connected to a central portion of the second end surface 34.

The lower arm element 21 and the upper arm element 22 are accommodated inside a package (box body) of the power module 20. The negative-electrode-side input terminal 35 is connected to the lower arm element 21. The positive-electrode-side input terminal 36 is connected to the upper arm element 22. The output terminal 37 is connected between the lower arm element 21 and the upper arm element 22.

Figure 7:
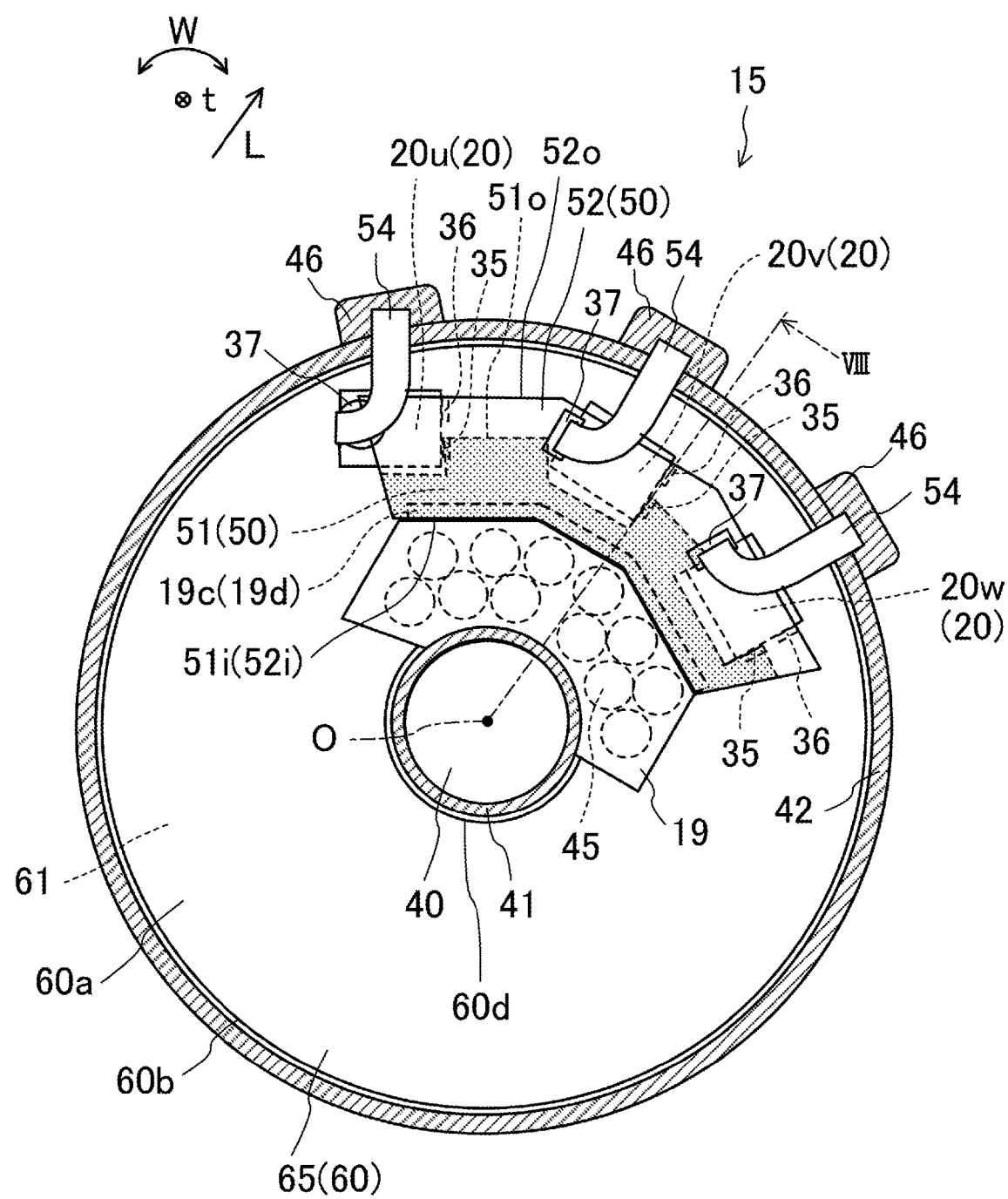
FIG. 7 is a cross sectional view of the inverter when seen from a side opposite to the motor.
Figure 8:
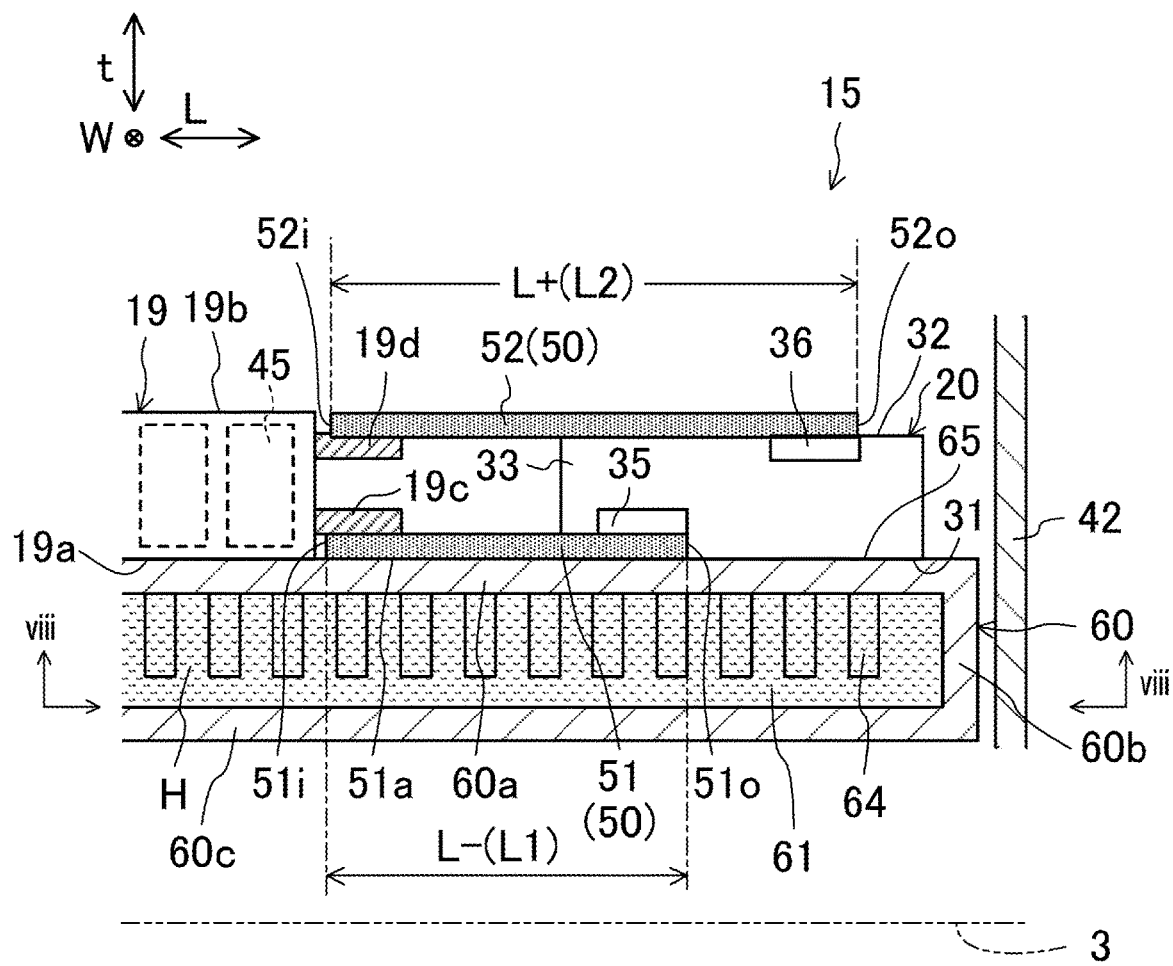
FIG. 8 is a vertical sectional view of the inverter.

FIG. 7 is a cross sectional view of the inverter 15 when seen from a side opposite to the motor 3. FIG. 8 is a vertical sectional view of the inverter 15 along line VIII-VIII. As shown in FIG. 7, an axial through hole 40 through which the rotation shaft 3a of the motor 3 passes is provided in the center of the inverter 15. A cylindrical boss portion 41 is formed around the axial through hole 40. The smoothing capacitor 19 is disposed along the boss portion 41.

Each power module 20 (the U-phase power module 20u, the V-phase power module 20v, and the W-phase power module 20w) are disposed closer to an outer peripheral side than the smoothing capacitor 19. On the outer peripheral side of the smoothing capacitor 19, each power module 20 is disposed side by side in a peripheral direction of the motor 3. The input terminals 35 and 36 (the first end surface 33) and the output terminal 37 (the second end surface 34) of each power module 20 face the peripheral direction of the motor 3 (the inverter 15). Each power module 20 is disposed so that the thickness direction t coincides with the axial direction of the motor 3. The smoothing capacitor 19 and each power module 20 are disposed in a space defined by an outer peripheral wall portion 42 and the boss portion 41 of the inverter 15.

As shown in FIGS. 7 and 8, a heat sink 60 is provided on a motor 3 side of the inverter 15. The heat sink 60 is primarily used for cooling each power module 20. The heat sink 60 is disposed between the outer peripheral wall portion 42 and the boss portion 41 of the inverter 15. The heat sink 60 has an upper wall portion 60a, an outer peripheral wall portion 60b, a lower wall portion 60c, and an inner peripheral wall portion 60d.

An upper surface 65 of the upper wall portion 60a of the heat sink 60 constitutes a placement surface orthogonal to the axial direction of the motor 3 (may hereunder be referred to as "placement surface 65"). The lower surface (first cooling surface) 31 of each power module 20 (the U-phase power module 20u, the V-phase power module 20v, and the W-phase power module 20w) faces the motor 3. Specifically, the lower surface (first cooling surface) 31 of each power module 20 is placed side by side on the same placement surface 65.

As shown in FIGS. 7 and 8, the smoothing capacitor 19 is one in which an assembly of a plurality of columnar capacitors 45 is covered by a flat plate from both sides in the thickness direction. The smoothing capacitor 19 has a lower surface 19a, serving as a third cooling surface, on a lower side (one surface side, the one side in the thickness direction). The smoothing capacitor 19 has an upper surface 19b on a side opposite to the lower surface 19a. The lower surface 19a and the upper surface 19b of the smoothing capacitor 19 are constituted by flat plates. The lower surface (third cooling surface) 19a of the smoothing capacitor 19 faces the motor 3. Specifically, the lower surface (third cooling surface) 19a of the smoothing capacitor 19 is placed on the placement surface 65.

As shown in FIGS. 7 and 8, the smoothing capacitor 19 and each power module 20 are connected to each other by a negative-electrode-side busbar 51 and a positive-electrode-side busbar 52, serving as input busbars 50 (may hereunder be simply referred to as "busbars 50"). The negative-electrode-side busbar 51 and the positive-electrode-side busbar 52 each have a plate shape. Specifically, the negative-electrode-side busbar 51 and the positive-electrode-side busbar 52 are longer in the width direction W and a length direction L than in the thickness direction t.

As shown in FIG. 7, the negative-electrode-side busbar 51 and the positive-electrode-side busbar 52 are formed with wide widths so as to be extend along the peripheral direction of the motor 3 (the inverter 15). In other words, the negative-electrode-side busbar 51 and the positive-electrode-side busbar 52 are formed with wide widths so as to extend along a direction in which each power module 20 is disposed side by side. The width direction W of the negative-electrode-side busbar 51 and the positive-electrode-side busbar 52 is the peripheral direction of the motor 3 (an arc shape is formed). The negative-electrode-side busbar 51 and the positive-electrode-side busbar 52 each have a fan shape. The length direction L of the negative-electrode-side busbar 51 and the positive-electrode-side busbar 52 is the radial direction of the motor 3.

One end portion 51i of the negative-electrode-side busbar 51 is connected to a negative-electrode terminal 19c provided on the lower surface 19a side of the smoothing capacitor 19. The other end portion 51o of the negative-electrode-side busbar 51 is connected to a negative-electrode-side input terminal 35 of each power module 20. One end portion 52i of the positive-electrode-side busbar 52 is connected to a positive-electrode terminal 19d provided on the upper surface 19b side of the smoothing capacitor 19. An other end portion 52o of the positive-electrode-side busbar 52 is connected to a positive-electrode-side input terminal 36 of each power module 20.

The negative-electrode-side busbar 51 has a lower surface 51a, serving as a second cooling surface, on the lower side (one surface side, the one side in the thickness direction). The lower surface (second cooling surface) 51a of the negative-electrode-side busbar 51 faces the motor 3. Specifically, the lower surface (second cooling surface) 51a of the negative-electrode-side busbar 51 is placed on the placement surface 65.

As shown in FIG. 7, output busbars 54 are each connected to the output terminal 37 of a corresponding one of the power modules 20. There are a total of three output busbars 54 corresponding to the U phase, the V phase, and the W phase. The output busbars 54 are each interposed between the corresponding one of the power modules 20 and a corresponding one of the coils 17. The output busbars 54 each have a plate shape. In addition to the output busbars 54, a wire harness or the like may be interposed between the corresponding one of the power modules 20 and the corresponding one of the coils 17.

Three inverter-side terminal blocks 46 are provided at an outer peripheral portion of the inverter 15. The inverter-side terminal blocks 46 corresponding to the respective power modules 20. The output busbars 54 extend up to the respective inverter-side terminal blocks 46. Electrically conductive members (busbars, wire harnesses, or the like) are each interposed between a corresponding one of the inverter-side terminal blocks 46 and a corresponding one of the motor-side terminal blocks 18.

Busbar Inductance Sensitivity

Figure 9:
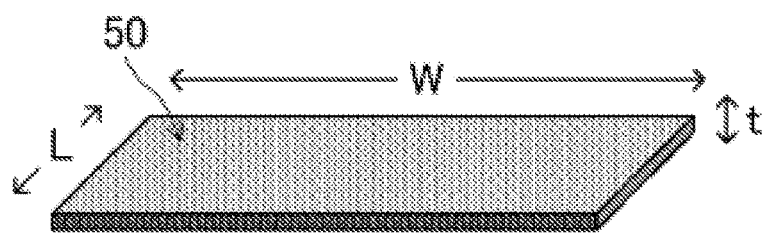
FIG. 9 is a perspective view of a busbar.
Figure 10:
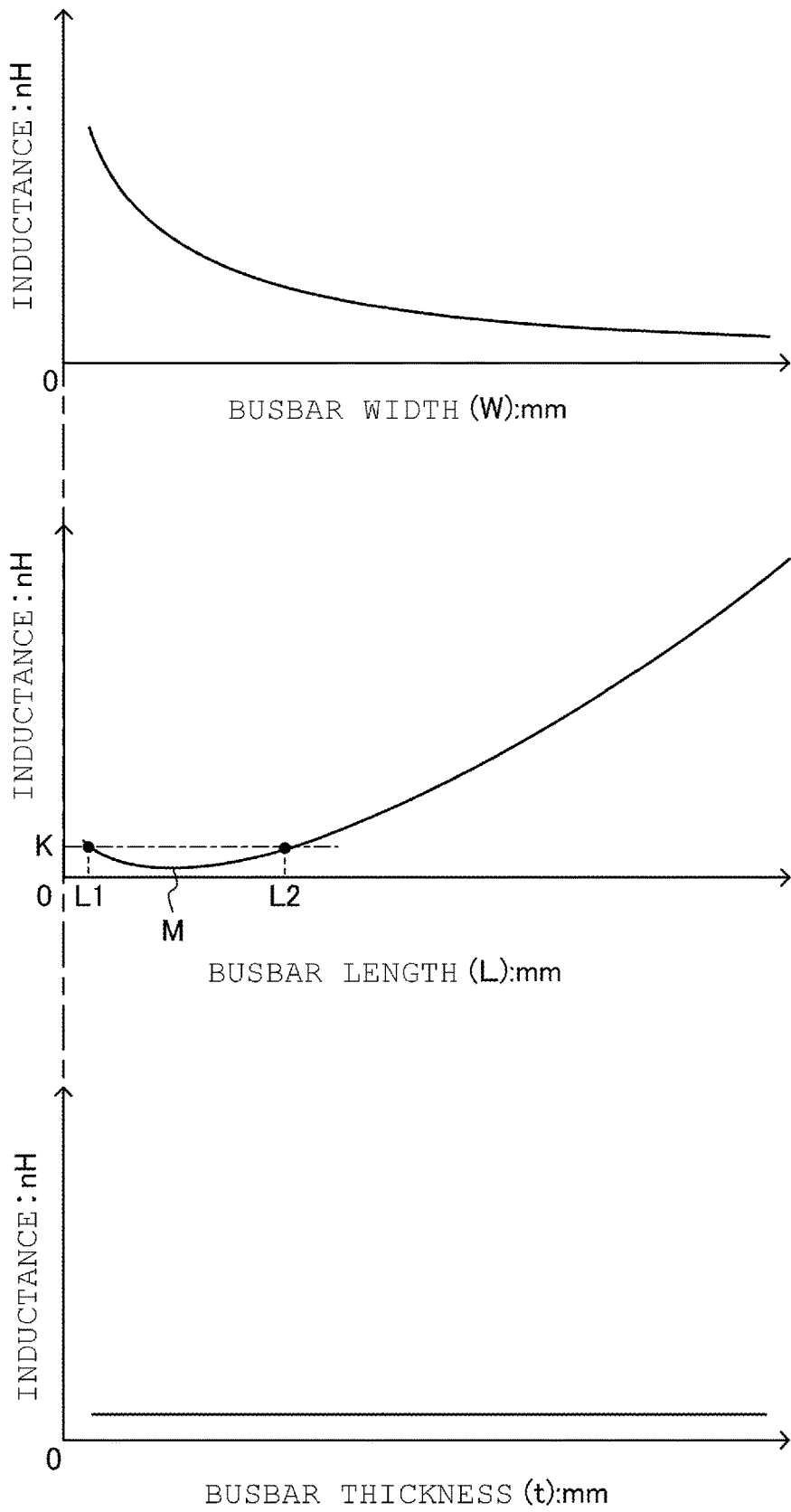
FIG. 10 shows graphs showing the relationship between size and inductance sensitivity of busbar.

FIG. 9 is a perspective view of a busbar 50. FIG. 10 shows graphs showing the relationship between size and inductance sensitivity of busbar 50. As a result of assiduous studies, the inventor of the present application and others have found the following with regard to the relationship between the size and inductance sensitivity of busbar 50.

As shown in FIGS. 9 and 10, the larger a width W (mm) of busbar 50, the smaller an inductance sensitivity (nH) of busbar 50.

Basically, the larger a length L (mm) of busbar 50, the larger the inductance sensitivity (nH) of busbar 50. However, as shown in the middle graph in FIG. 10, a minimum value (inflection point) M exists in the relationship between the length L (mm) and the inductance sensitivity (nH) of busbar 50. Therefore, even if lengths L differ from each other, the inductance sensitivity (nH) may become the same. Specifically, the inductance sensitivity (nH) of busbar 50 (51, 52) is a function of the length L (mm) extending from the one end portion 51*i* or 52*i* of busbar 50 (51, 52) (the terminal 19*c* or 19*d* of the smoothing capacitor 19) to the other end portion 51*o* or 52*o* of busbar 50 (51, 52) (the input terminal 35 or 36 of each power module 20). The function has the minimum value M so that the inductance sensitivity K (nH) becomes the same at a first length L1 (mm) and a second length L2 (mm) that differ from each other. The second length L2 (mm) is larger than the first length L1 (mm).

Even if a thickness t (mm) of busbar 50 changes, the inductance sensitivity (nH) of busbar 50 does not change.

As shown in FIG. 7, the width of the negative-electrode-side busbar 51 and the width of the positive-electrode-side busbar 52 are substantially the same. As shown in FIG. 8, a length L− of the negative-electrode-side busbar 51 and a length L+ of the positive-electrode-side busbar 52 differ from each other. The length L− of the negative-electrode-side busbar 51 corresponds to the first length L1. The length L+ of the positive-electrode-side busbar 52 corresponds to the second length L2. The length L+ of the positive-electrode-side busbar 52 (the second length L2) is larger than the length L− of the negative-electrode-side busbar 51 (the first length L1). However, due to the existence of the minimum value M above, the inductance of the negative-electrode-side busbar 51 and the inductance of the positive-electrode-side busbar 52 are equal to each other.

Cooling Path

Figure 11:
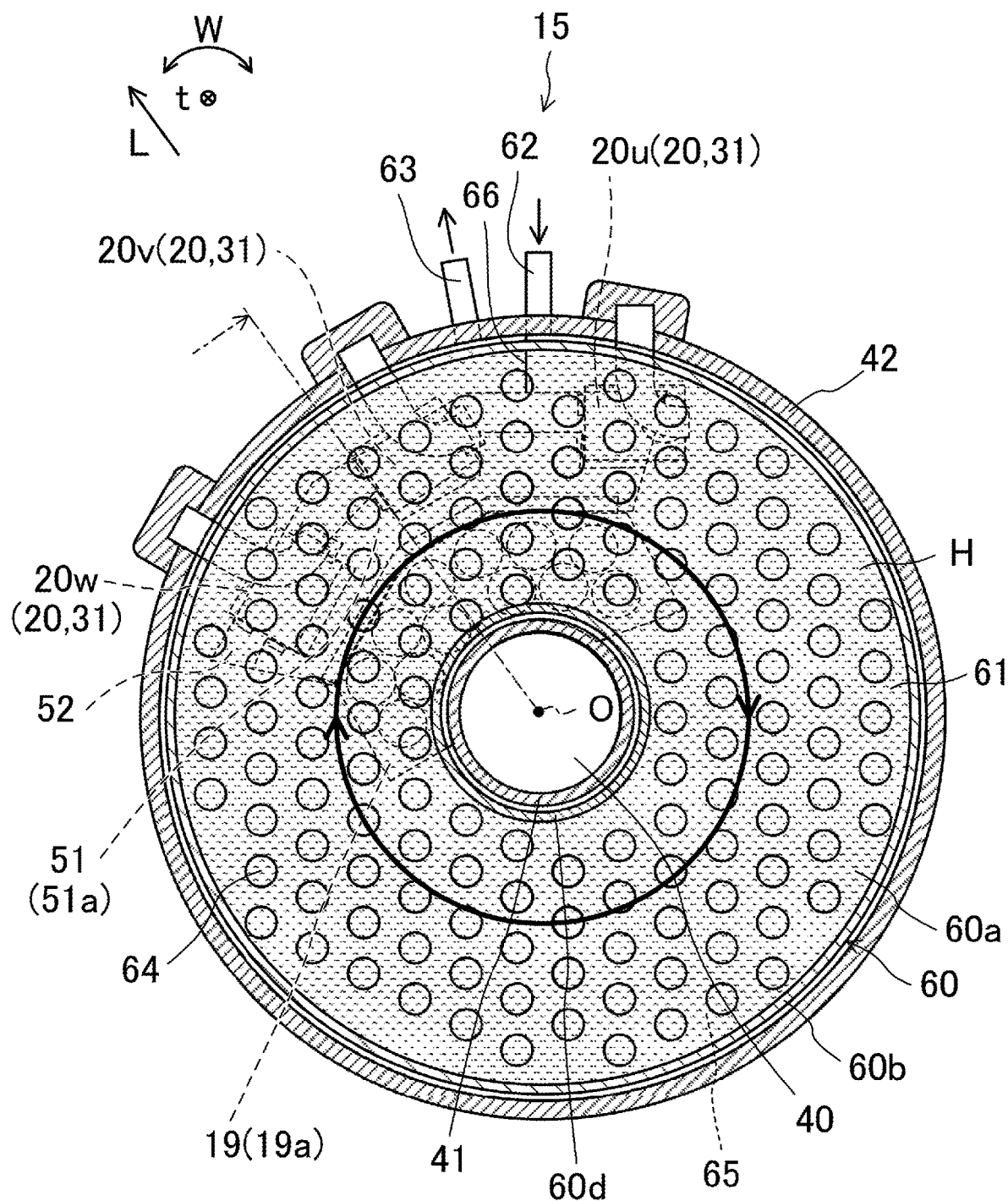
FIG. 11 is cross sectional view of a cooling path of the inverter when seen from the motor.

FIG. 11 is cross sectional view of a cooling path 61 of the inverter 15 when seen from the motor 3. As shown in FIGS. 8 and 11, the cooling path (cooling jacket) 61, serving as a cooling portion, is provided inside the heat sink 60. The cooling path 61 is defined by the upper wall portion 60*a*, the outer peripheral wall portion 60*b*, the lower wall portion 60*c*, and the inner peripheral wall portion 60*d*. The cooling path 61 is formed with a doughnut shape (ring shape, cylindrical shape) over the entire periphery when seen in the axial direction of the motor 3 (the inverter 15). The rotation shaft 3*a* of the motor 3 passes through an inner side of the inner peripheral wall portion 60*d*. As described above, the upper surface of the upper wall portion 60*a* of the heat sink 60 is the placement surface 65.

The cooling path 61 is provided closer to the motor 3 than the placement surface 65. A cooling medium H flows in the cooling path 61. The cooling medium H is, for example, cooling water or cooling oil.

A plurality of fins 64, serving as cooling portions, are provided inside the heat sink 60 (the cooling path 61). The fins 64 extend downward inside the cooling path 61 from the upper wall portion 60*a*. That is, the fins 64 are provided closer to the motor 3 than the placement surface 65.

As shown in FIGS. 8 and 11, when seen in the axial direction of the motor 3 (the inverter 15), the cooling path (cooling portion) 61 faces all of the lower surface (first cooling surface) 31 of each power module 20, the lower surface (second cooling surface) 51*a* of the negative-electrode-side busbar 51, and the lower surface (third cooling surface) 19*a* of the smoothing capacitor 19.

Similarly, when seen in the axial direction of the motor 3, the fins (cooling portions) 64 face all of the lower surface (first cooling surface) 31 of each power module 20, the lower surface (second cooling surface) 51*a* of the negative-electrode-side busbar 51, and the lower surface (third cooling surface) 19*a* of the smoothing capacitor 19.

As shown in FIG. 11, the inlet pipe 62 and the outlet pipe 63 are connected to an upper portion of the outer peripheral wall portion 42 of the inverter 15. The inlet pipe 62 and the outlet pipe 63 communicate with the cooling path 61. The cooling medium H introduced into the cooling path 61 via the inlet pipe 62 is discharged to the outside via the outlet pipe 63 after being guided to the outer peripheral wall portion 60*b* and the inner peripheral wall portion 60*d* and having flowed inside the cooling path 61 in the peripheral direction. Note that a guide plate 66 may be provided on a downstream side of the inlet pipe 62.

Operational Effects of First Embodiment

According to the present embodiment, since the lower surface (first cooling surface) 31 having a large area of each flat power module 20 having a wide width faces the cooling path 61 and the fins 64, serving as cooling portions, the cooling area of cooling each power module 20 by the cooling portions 61 and 64 can be increased. Therefore, even if only one surface (lower surface, first cooling surface) 31 of each power module 20 is cooled by the cooling portions 61 and 64, a sufficient cooling ability can be ensured.

The negative-electrode-side busbar 51 can be formed with a wide width by causing the negative-electrode-side busbar 51 to extend along a direction in which each power module 20 is disposed side by side (the peripheral direction of the motor 3). Since the lower surface (the second cooling surface) 51*a* having a large area of the plate-shaped negative-electrode-side busbar 51 having a wide width faces the cooling portions 61 and 64, the heat-dissipation area of dissipating heat to the cooling portions 61 and 64 from the negative-electrode-side busbar 51 can be increased. Therefore, even if the cooling ability of cooling each power module 20 by the cooling portions 61 and 64 is insufficient, the insufficient cooling ability can be compensated.

Since the lower surface (the first cooling surface) 31 of each power module 20 (the U-phase power module 20*u*, the V-phase power module 20*v*, and the W-phase power module 20*w*) is placed side by side on the same placement surface 65 orthogonal to the axial direction of the motor 3, the axial-direction length of the inverter 15 can be reduced. Since the cooling portions 61 and 64 need to be provided only on one surface (lower surface, first cooling surface) 31 side of each power module 20, the inverter 15 can be reduced in size compared with when the cooling portions 61 and 64 are provided on two surface sides of each power module 20.

Accordingly, while sufficiently cooling each power module 20, the size of the drive unit A including the motor 3 and the inverter 15 can be reduced.

By causing the cooling medium H to flow in the cooling path 61 serving as a cooling portion, the cooling ability of cooling each power module 20 by the cooling portion can be increased.

Since the size of the SiC-MOSFET chip 24 of each power module 20 is small, the size of the copper block 25, serving as a heat transfer block, that is placed on each SiC-MOSFET chip 24 can also be reduced (see FIG. 5). If each power module 20 is to be effectively cooled at two surfaces thereof, expensive ceramic substrates (for example, SiN) need to be disposed on two surface sides of the SiC-MOSFET chips 24. Therefore, cooling one surface of each power module 20 and increasing the effectiveness of cooling the one surface is advantageous in terms of costs than cooling two surfaces of each power module 20.

The smoothing capacitor 19, together with the power modules 20, can be cooled by the cooling portions 61 and 64.

The negative-electrode-side busbar 51 can be easily formed with a wide width by disposing each power module 20 side by side in the peripheral direction of the motor 3 on the outer peripheral side of the smoothing capacitor 19 and by causing the width direction W of the negative-electrode-side busbar 51 to be the peripheral direction of the motor 3. Therefore, the heat-dissipation area of dissipating heat to the cooling portions 61 and 64 from the negative-electrode-side busbar 51 can be easily increased.

Since the cooling portions 61 and 64 are provided on the side of the motor 3, this is advantageous in terms of also cooling wires (for example, the output busbars 54) that connect the coils 17 of the motor 3 and the respective power modules 20 to each other.

As shown by an alternate long and short dash lines in FIG. 1, in the related art, an inverter 15' is often disposed near a second battery unit 12b' of a battery 12'. According to the present embodiment, since the inverter 15 can be disposed adjacent to the motor 3 in the axial direction, the inverter 15 no longer needs to be disposed near the second battery unit 12b. Therefore, the layout of the second battery unit 12b can be provided with greater freedom, and the second battery unit 12b can be increased in size.

Reduction and Equalization of Inductance

The inductance of the busbar 51 and the inductance of the busbar 52 can be reduced by increasing the width of the busbar 51 and the width of the busbar 52.

Since the smoothing capacitor 19 and each of the power modules 20u, 20v, and 20w are placed on the same placement surface 65, the length of the busbars 51 and 52, each connecting the smoothing capacitor 19 to each of the power modules 20u, 20v, and 20w, can be reduced. Therefore, the inductance of the busbar 51 and the inductance of the busbar 52 can be reduced.

Since the motor 3 and the inverter 15 are disposed adjacent to each other in the axial direction, lengths of electrical paths between the power modules 20u, 20v, and 20w and the respective coils 17u, 17v, and 17w are reduced. Therefore, inductances of the electrical paths (including the output busbars 54) connecting the power modules 20u, 20v, and 20w and the respective coils 17u, 17v, and 17w can be reduced.

Since the power modules 20u, 20v, and 20w are disposed side by side in the peripheral direction of the motor 3 on the outer peripheral side of the smoothing capacitor 19, the distances between the smoothing capacitor 19 and the power modules 20u, 20v, and 20w can be made equal to each other. Further, at each of the busbars 51 and 52, inductances of electrical paths between the smoothing capacitor 19 and the power modules 20u, 20v, and 20w can be equalized by forming the busbars 51 and 52 with wide widths so as to extend along the peripheral direction of the motor 3.

By using the minimum value (the inflection point) M (see FIG. 10), even though the length L− of the negative-electrode-side busbar 51 (the first length L1) and the length L+ of the positive-electrode-side busbar 52 (the second length L2) differ from each other, the inductance of the negative-electrode-side busbar 51 and the inductance of the positive-electrode-side busbar 52 can be equalized with respect to each other.

Modification 1 of First Embodiment

Figure 12:
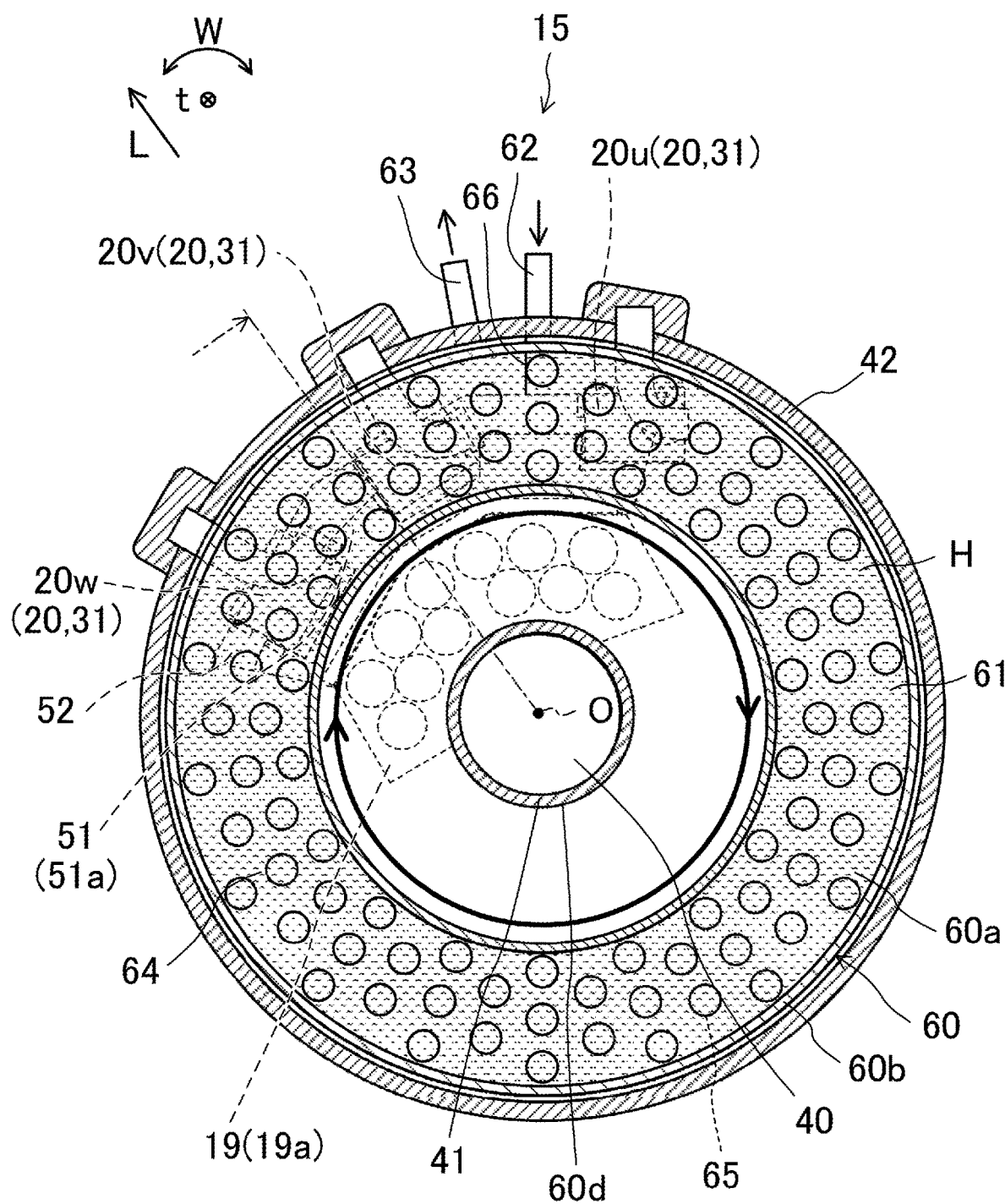
FIG. 12 is a view, corresponding to FIG. 11, of Modification 1 of the first embodiment, and is a cross sectional view of a cooling path of an inverter when seen from a motor.

FIG. 12 is a view, corresponding to FIG. 11, of Modification 1 of the first embodiment. According to the present modification, the cooling portions (the cooling path 61 and the fins 64) do not face the lower surface (the third cooling surface) 19a of the smoothing capacitor 19 at all. The cooling portions 61 and 64 do not face a part of the lower surface (the second cooling surface) 51a of the negative-electrode-side busbar 51.

Since the heat generation of amount the smoothing capacitor 19 is smaller than the heat generation amount of each power module 20, even if the smoothing capacitor 19 is not cooled by the cooling portions 61 and 64, this may not be a problem.

As long as the cooling portions 61 and 64 face a part of the lower surface (the second cooling surface) 51a of the negative-electrode-side busbar 51, the heat-dissipation effect of dissipating heat to the cooling portions 61 and 64 from the negative-electrode-side busbar 51 can be somewhat provided.

Modification 2 of First Embodiment

Figure 13:
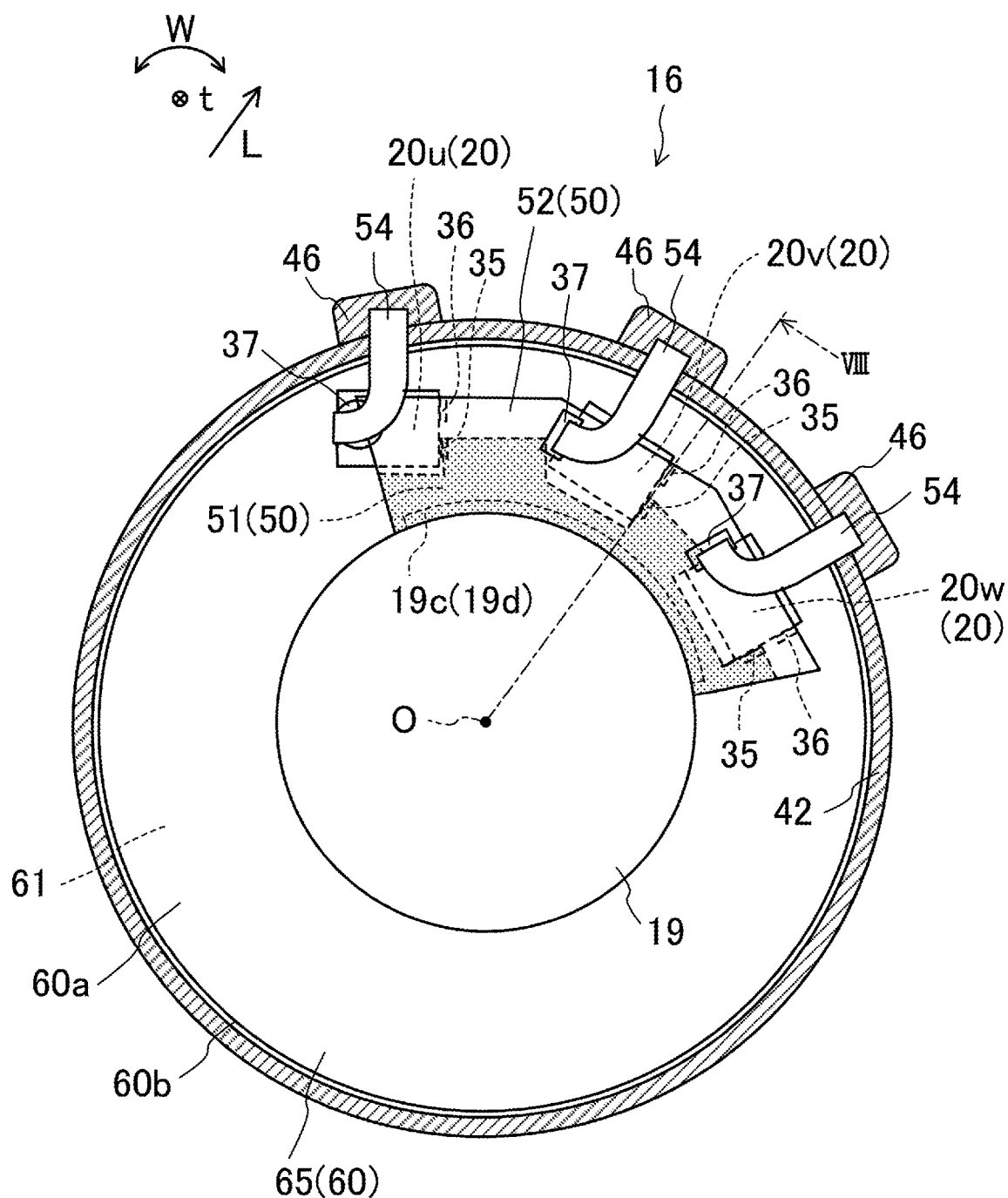
FIG. 13 is a view, corresponding to FIG. 7, of Modification 2 of the first embodiment, and is a cross sectional view of an inverter when seen from a side opposite to a motor.

FIG. 13 is a view, corresponding to FIG. 7, of Modification 2 of the first embodiment. The inverters 16 according to the present modification are disposed adjacent to the respective in-wheel motors 14 in the axial direction (vehicle width direction) of the in-wheel motors 14 (see FIG. 1). The inverters 16 do not have an axial through hole 40 and a boss portion 41. The smoothing capacitor 19 has a columnar shape, and is disposed at the center of the inverter 16. The heat sink 60 does not have the inner peripheral wall portion 60d. The cooling path 61 has a circular shape without a hole when seen in the axial direction of the motor 3.

Other Modifications of First Embodiment

The cooling medium H that flows in the cooling path 61 may be, for example, air. Further, the cooling portions may be constituted by, for example, only the fins 64 without providing the cooling path 61. The cooling portions may be solid cooling members.

The cooling portions need not be provided along the entire periphery, and may be provided only at portions in the peripheral direction facing the power modules 20.

Instead of the negative-electrode-side busbar 51, the positive-electrode-side busbar 52 may have a second cooling surface that faces the motor 3 and that is placed on the placement surface 65.

Although not shown, each output busbar 54 may be formed with a wide width so as to extend along the peripheral direction of the motor 3. In other words, the width direction of each output busbar 54 may be the peripheral direction (an arc shape is formed). Each output busbar 54 may have a fan shape. Therefore, since each output busbar 54 is easily formed with a wide width, the inductance of each output busbar 54 is easily reduced (see FIG. 10).

The placement surface 65 may include a plurality of surfaces that are positioned in the same plane orthogonal to the axial direction of the motor 3.

Second Embodiment

Figure 14:
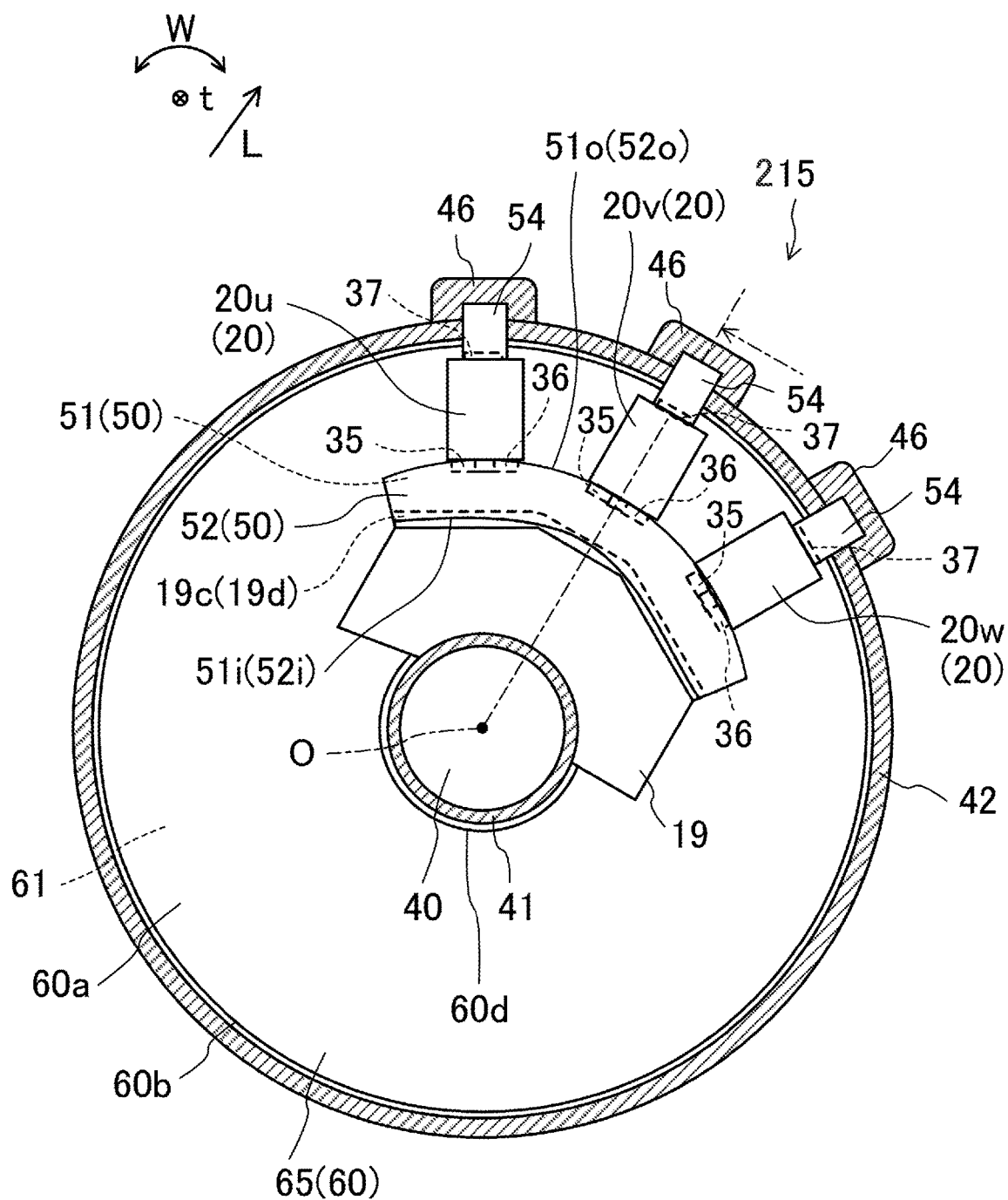
FIG. 14 is a view, corresponding to FIG. 7, of a second embodiment, and is a cross sectional view of an inverter when seen from a side opposite to a motor.
Figure 15:
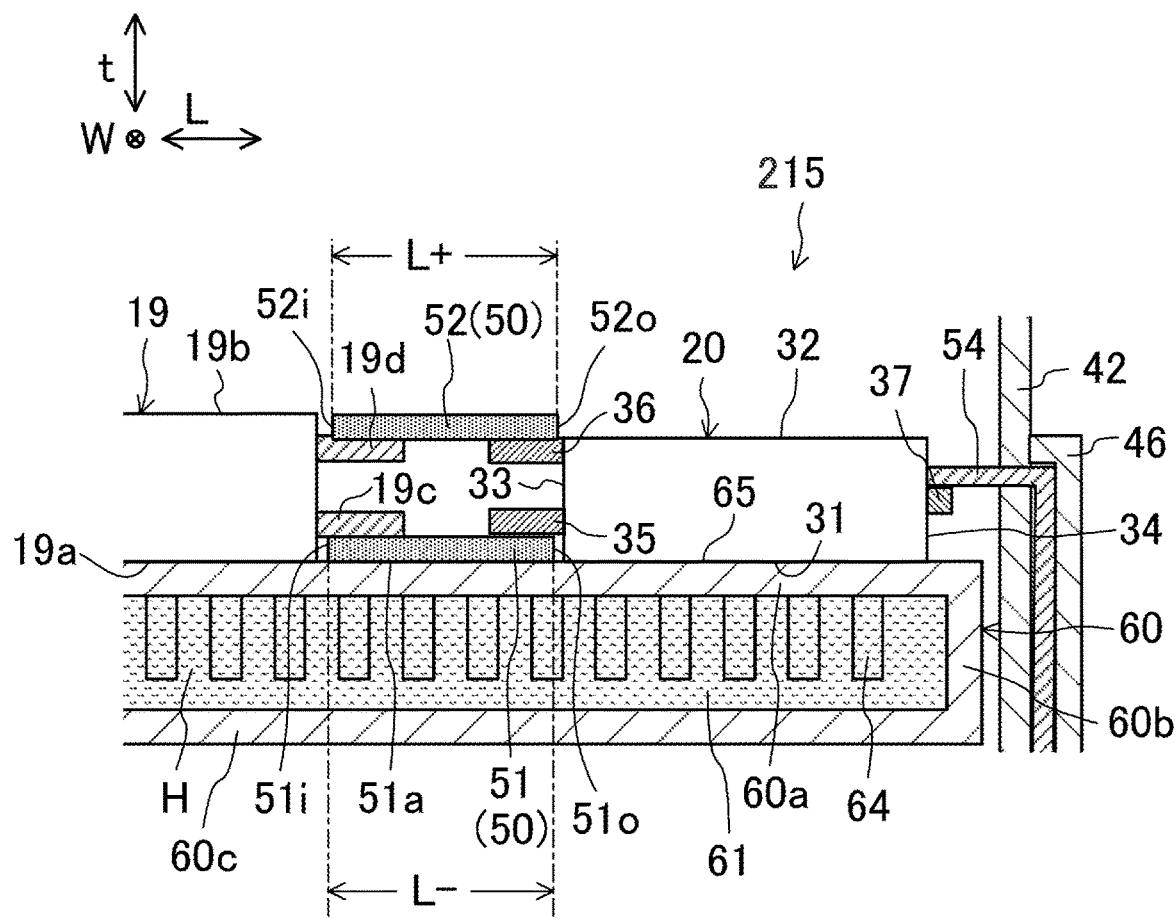
FIG. 15 is a view, corresponding to FIG. 8, of the second embodiment, and is a vertical sectional view of the inverter.

FIG. 14 is a view, corresponding to FIG. 7, of a second embodiment, and is a cross sectional view of an inverter 215 when seen from a side opposite to the motor 3. FIG. 15 is a view, corresponding to FIG. 8, of the second embodiment, and is a vertical sectional view of the inverter 215. A detailed description of structures that are the same as those of the embodiment above may not be given.

In the present embodiment, each power module 20 (the U-phase power module 20u, the V-phase power module 20v, and the W-phase power module 20w) is disposed closer to an outer peripheral side of a smoothing capacitor 19. On the outer peripheral side of the smoothing capacitor 19, the power modules 20 are disposed side by side in a peripheral direction of the motor 3.

The input terminals 35 and 36 (first end surface 33) and the output terminal 37 (second end surface 34) of each power module 20 face a radial direction of the motor 3 (the inverter 215). Specifically, the input terminals 35 and 36 (the first end surface 33) of each power module 20 face an inner peripheral side. The output terminal 37 (the second end surface 34) of each power module 20 faces the outer peripheral side. Each power module 20 is disposed radially from the center O, which is the origin, of the inverter 215 (the motor 3).

Similarly to the embodiment above, the lower surface (first cooling surface) 31 of each power module 20, the lower surface (second cooling surface) 51a of the negative-electrode-side busbar 51, and the lower surface (third cooling surface) 19a of the smoothing capacitor 19 are placed on the placement surface 65.

As shown in FIG. 14, the width of the negative-electrode-side busbar 51 and the width of the positive-electrode-side busbar 52 are the same. As shown in FIG. 15, a length L− of the negative-electrode-side busbar 51 and a length L+ of the positive-electrode-side busbar 52 are the same. Therefore, the inductance of the negative-electrode-side busbar 51 and the inductance of the positive-electrode-side busbar 52 are equal to each other.

The other structures are the same as those of the first embodiment.

Third Embodiment

Figure 16:
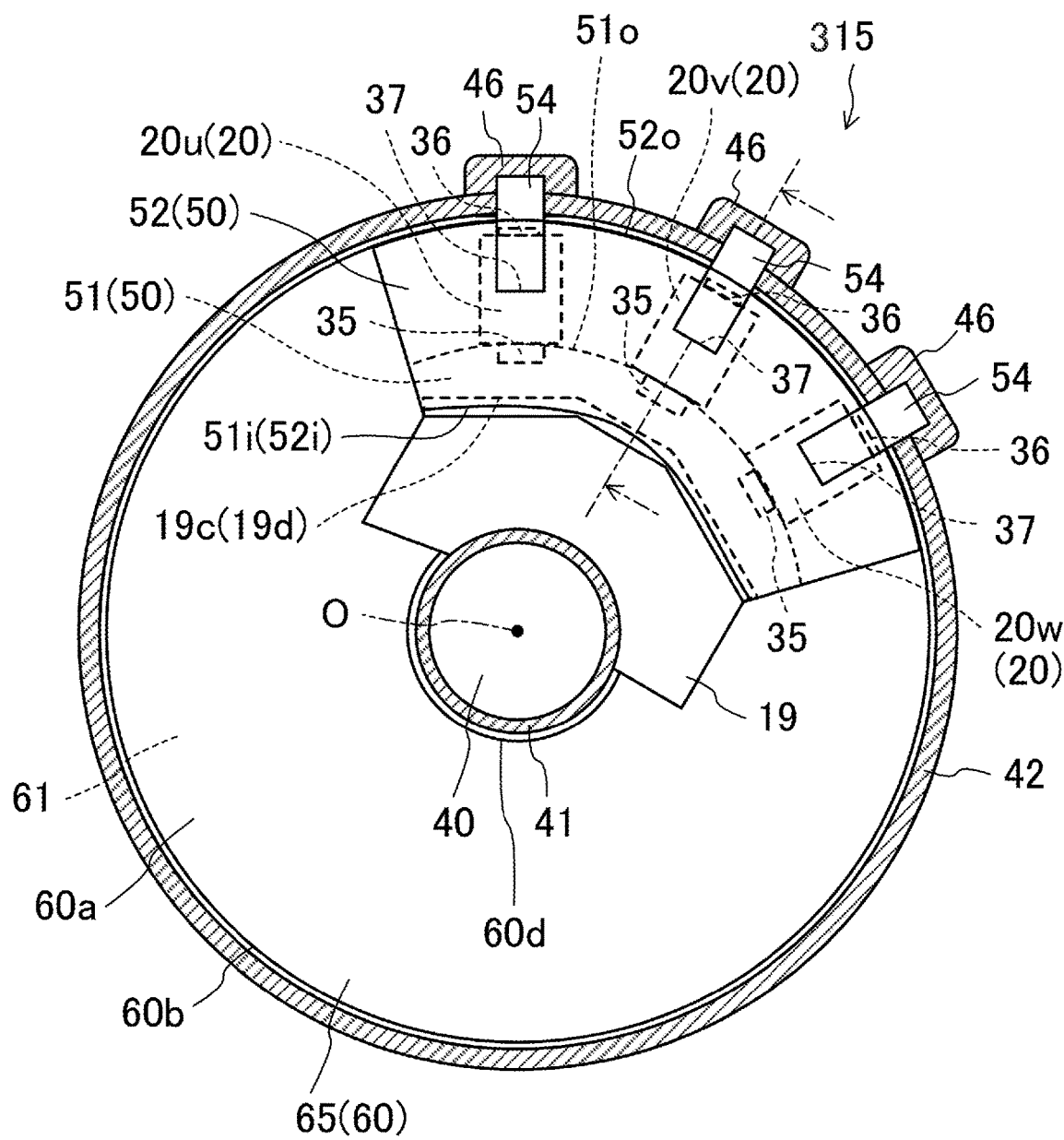
FIG. 16 is a view, corresponding to FIG. 7, of a third embodiment, and is a cross sectional view of an inverter when seen from a side opposite to a motor.
Figure 17:
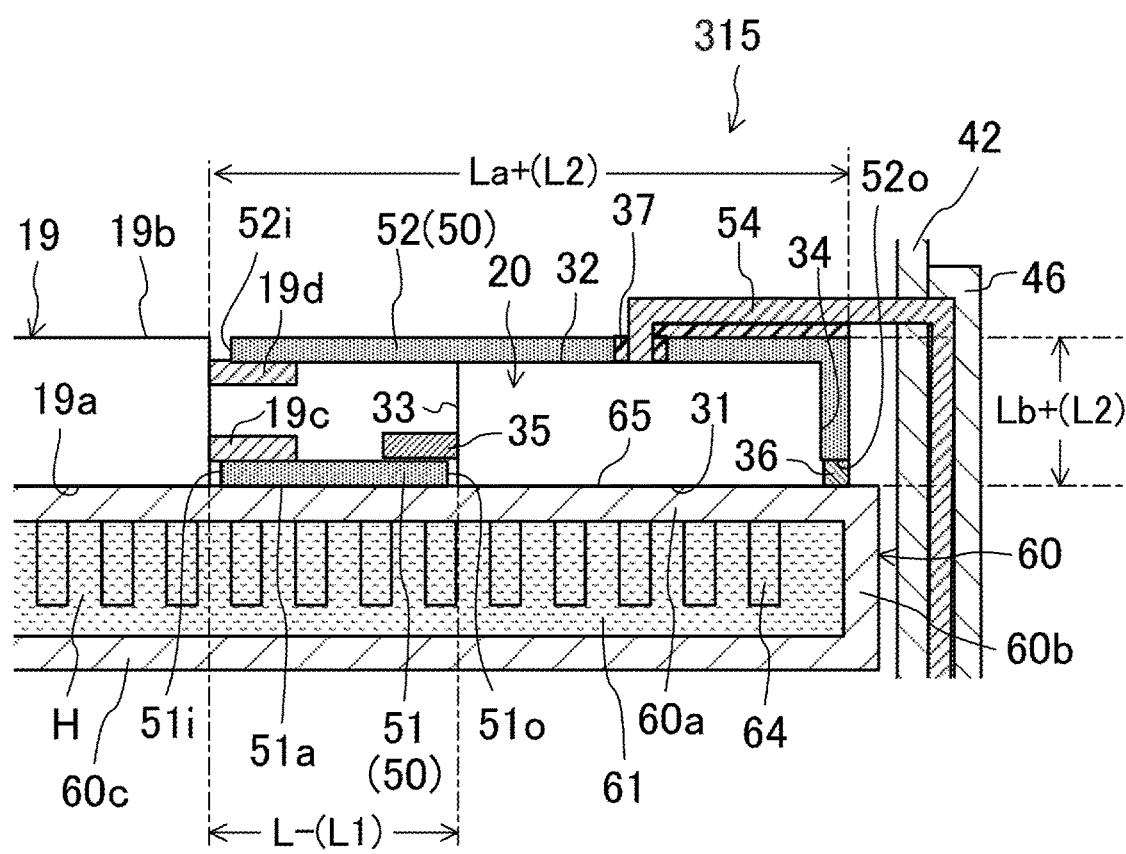
FIG. 17 is a view, corresponding to FIG. 8, of the third embodiment, and is a vertical sectional view of the inverter.

FIG. 16 is a view, corresponding to FIG. 7, of a third embodiment, and is a cross sectional view of an inverter 315 when seen from a side opposite to the motor 3. FIG. 17 is a view, corresponding to FIG. 8, of the third embodiment, and is a vertical sectional view of the inverter 315. A detailed description of structures that are the same as those of the embodiments above may not be given.

As shown in FIGS. 16 and 17, the negative-electrode-side input terminals 35 are each connected to a lower side of the first end surface 33 of a corresponding one of power modules 20. The positive-electrode-side input terminals 36 are each connected to a lower side of the second end surface 34 of the corresponding one of the power modules 20. The output terminals 37 are each connected to the center of the upper surface 32 of the corresponding one of the power modules 20.

The negative-electrode-side busbar 51 connects the negative-electrode terminal 19c of the smoothing capacitor 19 and the negative-electrode-side input terminal 35 of each power module to each other. The positive-electrode-side busbar 52 connects the positive-electrode terminal 19d of the smoothing capacitor 19 and the positive-electrode-side input terminal 36 of each power module 20 to each other.

The positive-electrode-side busbar 52 starts out from the positive-electrode terminal 19d of the smoothing capacitor 19 (one end portion 52i), and extends along the upper surface 32 to the second end surface 34 from the first end surface 33 of each power module 20. Then, the positive-electrode-side busbar 52 bends downward and extends along the second end surface 34 up to the positive-electrode-side input terminal 36 (other end portion 52o) on the lower side of each power module 20. In other words, the positive-electrode-side busbar 52 extends so as to be wound around each power module 20 from the upper surface 32. Each output busbar 54 starts out from the output terminal 37 at the upper surface 32 of each power module 20, and extends upward. The positive-electrode-side busbar 52 has three opening portions for passing three upwardly extending output busbars 54 therethrough.

Similarly to the embodiments above, the lower surface (first cooling surface) 31 of each power module 20, the lower surface (second cooling surface) 51a of the negative-electrode-side busbar 51, and the lower surface (third cooling surface) 19a of the smoothing capacitor 19 are placed on the placement surface 65.

As shown in FIG. 16, the width of the negative-electrode-side busbar 51 and the width of the positive-electrode-side busbar 52 are the same. As shown in FIG. 17, the length (L−) of the negative-electrode-side busbar 51 and the length (sum of La+ and Lb+) of the positive-electrode-side busbar 52 differ from each other. The length (L−) of the negative-electrode-side busbar 51 corresponds to the first length L1. The length (sum of La+ and Lb+) of the positive-electrode-side busbar 52 corresponds to the second length L2. The length (sum of La+ and Lb+, the second length L2) of the positive-electrode-side busbar 52 is larger than the length (L−, the first length L1) of the negative-electrode-side busbar 51. However, due to the existence of the minimum value M (see FIG. 10), the inductance of the negative-electrode-side busbar 51 and the inductance of the positive-electrode-side busbar 52 are equal to each other.

Note that the conditions (for example, materials) of the negative-electrode-side busbar 51 and the positive-electrode-side busbar 52 according to the present embodiment differ from those of the embodiments above. Therefore, the mode of the minimum value (M above) (see FIG. 10) also differs. Specifically, the difference between the first length L1 and the second length L2 is larger than that in the embodiments above.

The other structures are the same as those of the second embodiment.

Modification 1 of Third Embodiment

Figure 18:
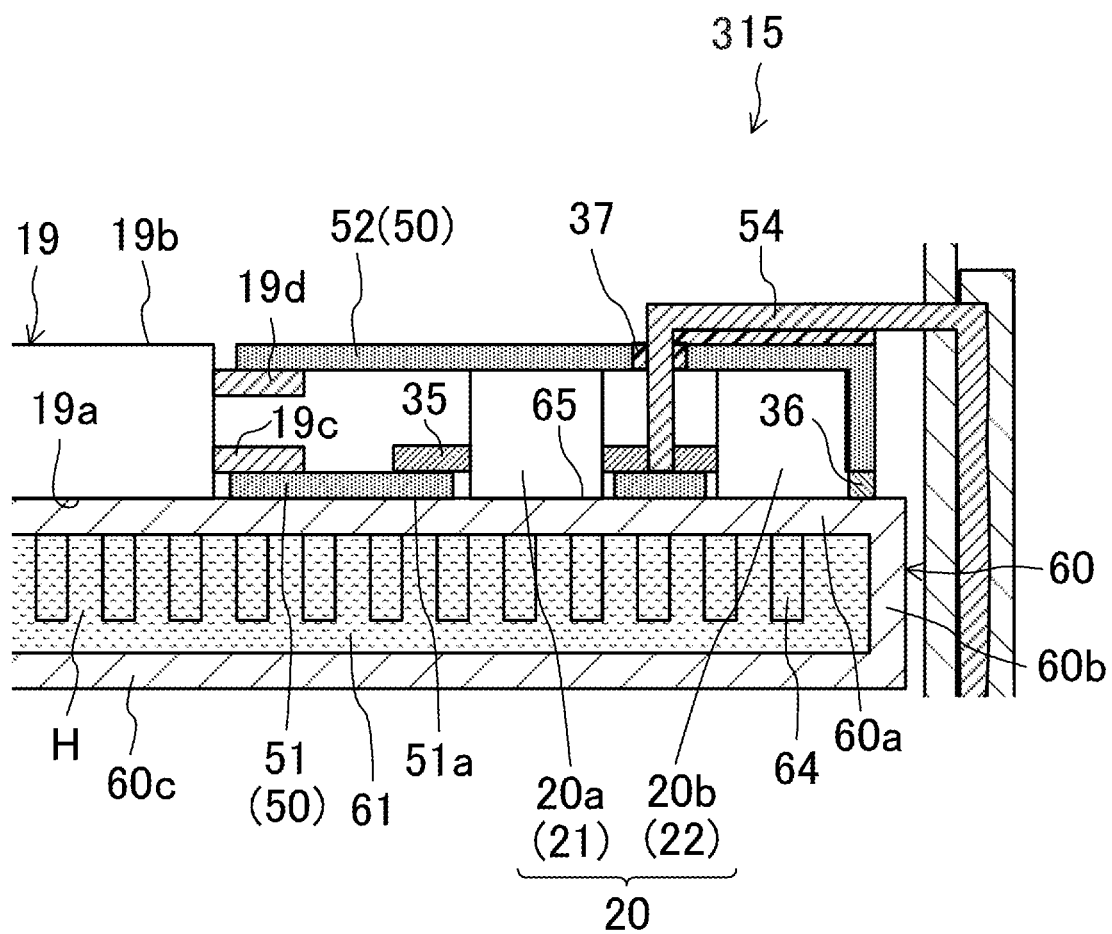
FIG. 18 is a view, corresponding to FIG. 8, of Modification 1 of the third embodiment, and is a vertical sectional view of an inverter.

FIG. 18 is a view, corresponding to FIG. 8, of Modification 1 of the third embodiment, and is a vertical sectional view of the inverter 315. Although in the embodiments above, each power module 20 accommodates both the lower arm element 21 and the upper arm element 22 in one package, the present modification differs. In the present modification, each power module 20 is separated into a first package 20a that accommodates the lower arm element 21 and a second package 20b that accommodates the upper arm element 22.

Modification 2 of Third Embodiment

Figure 19:
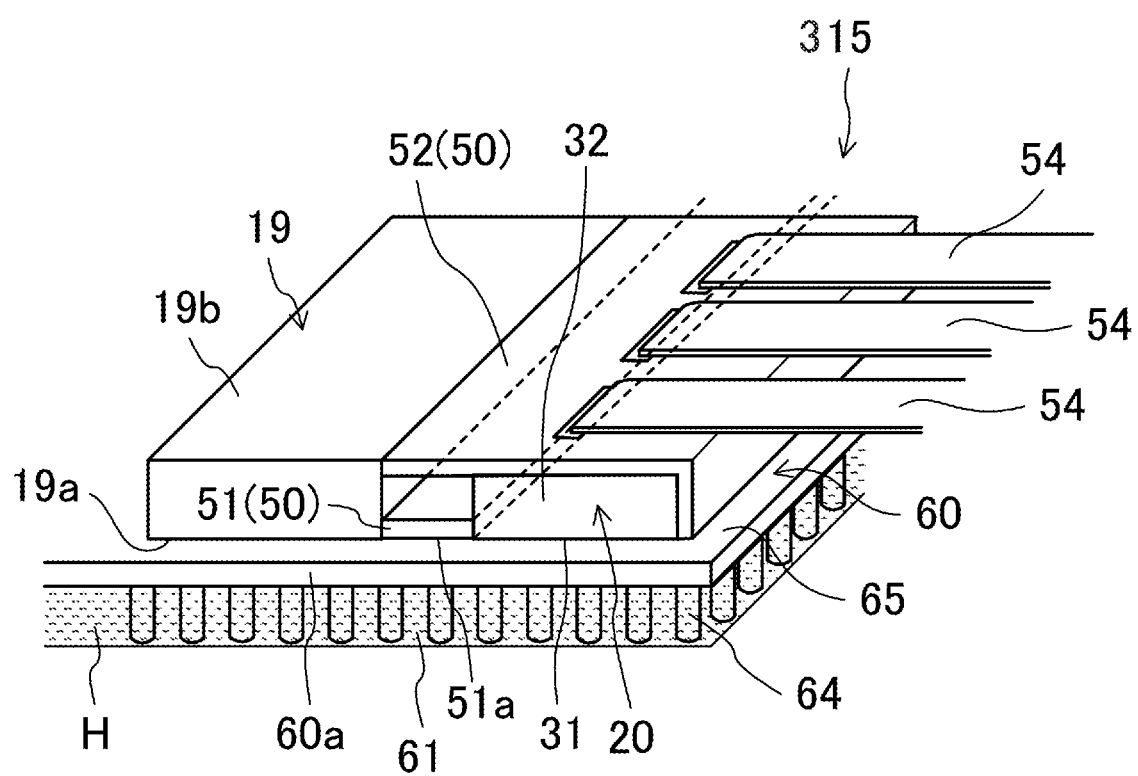
FIG. 19 is a perspective view of power modules and busbars according to Modification 2 of the third embodiment.

FIG. 19 is a perspective view of the power modules 20 and the busbars 50 according to Modification 2 of the third embodiment. In the present modification, each power module 20 (the U-phase power module 20u, the V-phase power module 20v, and the W-phase power module 20w) is linearly disposed side by side. The width direction of each of the busbars 51 and 52 is a linear direction (direction in which each power module 20 is disposed side by side).

OTHER EMBODIMENTS

Although the present disclosure has been described by way of preferred embodiments above, such descriptions are not limiting matters, and, naturally, various modifications are possible.

The present disclosure is applicable to a vehicle drive unit, and thus is very effective and has high industrial applicability.

What is claimed is:

1. A vehicle drive unit including a motor and an inverter disposed adjacent to each other in an axial direction of the motor, the inverter having a smoothing capacitor and a plurality of power modules, wherein the smoothing capacitor and each power module are connected to each other by a busbar, wherein each power module has a flat shape having a width greater than a thickness thereof, and has a first cooling surface disposed on one surface side and facing the motor, wherein the first cooling surface of each power module is placed side by side on a placement surface orthogonal to the axial direction, wherein each of the busbars has a plate shape, and has a second cooling surface disposed on the one surface side and facing the motor, wherein one end portion of each busbar is connected to the smoothing capacitor, wherein the other end portion of each busbar is connected to each power module respectively, wherein each busbar is formed with a width greater than a thickness thereof so as to extend widthwise along a direction in which each power module is disposed side by side, wherein the second cooling surface is placed on the placement surface, and wherein a cooling portion facing the first cooling surface and the second cooling surface is provided closer to the motor than the placement surface.

2. The vehicle drive unit according to claim 1, wherein the cooling portion includes a cooling path in which a cooling medium flows.

3. The vehicle drive unit according to claim 2, wherein each power module includes a silicon carbide metal-oxide-semiconductor field-effect transistor.

4. The vehicle drive unit according to claim 3, wherein the smoothing capacitor has a third cooling surface disposed on the one surface side and facing the motor,
    wherein the third cooling surface is placed on the placement surface, and
    wherein the cooling portion also faces the third cooling surface.

5. The vehicle drive unit according to claim 4, wherein each power module is disposed closer to an outer peripheral side than the smoothing capacitor, and
    wherein the busbar is formed so that the width thereof extends along a peripheral direction of the motor.

6. The vehicle drive unit according to claim 5, wherein an inductance of the busbar is a function of a length extending from the one end portion to the other end portion of the busbar,
    wherein the function has a minimum value so that the inductance becomes the same at a first length and a second length that differ from each other,
    wherein the smoothing capacitor and each power module are connected to each other by two of the busbars, the two busbars being a negative-electrode-side busbar and a positive-electrode-side busbar,
    wherein a length of one of the negative-electrode-side busbar and the positive-electrode-side busbar is the first length,
    wherein a length of the other of the negative-electrode-side busbar and the positive-electrode-side busbar is the second length, and
    wherein at least one of the negative-electrode-side busbar and the positive-electrode-side busbar has the second cooling surface.

7. The vehicle drive unit according to claim 1, wherein each power module includes a silicon carbide metal-oxide-semiconductor field-effect transistor.

8. The vehicle drive unit according to claim 1, wherein the smoothing capacitor has a third cooling surface disposed on the one surface side and facing the motor,
    wherein the third cooling surface is placed on the placement surface, and
    wherein the cooling portion also faces the third cooling surface.

9. The vehicle drive unit according to claim 1, wherein each power module is disposed closer to an outer peripheral side than the smoothing capacitor, and
    wherein the busbar is formed with a wide width so as to extend along a peripheral direction of the motor.

10. The vehicle drive unit according to claim 1, wherein an inductance of the busbar is a function of a length extending from the one end portion to the other end portion of the busbar,
    wherein the function has a minimum value so that the inductance becomes the same at a first length and a second length that differ from each other,
    wherein the smoothing capacitor and each power module are connected to each other by two of the busbars, the two busbars being a negative-electrode-side busbar and a positive-electrode-side busbar,
    wherein a length of one of the negative-electrode-side busbar and the positive-electrode-side busbar is the first length,
    wherein a length of the other of the negative-electrode-side busbar and the positive-electrode-side busbar is the second length, and
    wherein at least one of the negative-electrode-side busbar and the positive-electrode-side busbar has the second cooling surface.

11. The vehicle drive unit according to claim 2, wherein the smoothing capacitor has a third cooling surface disposed on the one surface side and facing the motor,
    wherein the third cooling surface is placed on the placement surface, and
    wherein the cooling portion also faces the third cooling surface.

12. The vehicle drive unit according to claim 2, wherein each power module is disposed closer to an outer peripheral side than the smoothing capacitor, and
    wherein the busbar is formed with a wide width so as to extend along a peripheral direction of the motor.

13. The vehicle drive unit according to claim 2, wherein an inductance of the busbar is a function of a length extending from the one end portion to the other end portion of the busbar,
    wherein the function has a minimum value so that the inductance becomes the same at a first length and a second length that differ from each other,
    wherein the smoothing capacitor and each power module are connected to each other by two of the busbars, the two busbars being a negative-electrode-side busbar and a positive-electrode-side busbar, wherein a length of one of the negative-electrode-side busbar and the positive-electrode-side busbar is the first length, wherein a length of the other of the negative-electrode-side busbar and the positive-electrode-side busbar is the second length, and wherein at least one of the negative-electrode-side busbar and the positive-electrode-side busbar has the second cooling surface.

14. The vehicle drive unit according to claim 7, wherein the smoothing capacitor has a third cooling surface disposed on the one surface side and facing the motor, wherein the third cooling surface is placed on the placement surface, and wherein the cooling portion also faces the third cooling surface.

15. The vehicle drive unit according to claim 7, wherein each power module is disposed closer to an outer peripheral side than the smoothing capacitor, and wherein the busbar is formed with a wide width so as to extend along a peripheral direction of the motor.

16. The vehicle drive unit according to claim 7, wherein an inductance of the busbar is a function of a length extending from the one end portion to the other end portion of the busbar, wherein the function has a minimum value so that the inductance becomes the same at a first length and a second length that differ from each other, wherein the smoothing capacitor and each power module are connected to each other by two of the busbars, the two busbars being a negative-electrode-side busbar and a positive-electrode-side busbar, wherein a length of one of the negative-electrode-side busbar and the positive-electrode-side busbar is the first length, wherein a length of the other of the negative-electrode-side busbar and the positive-electrode-side busbar is the second length, and wherein at least one of the negative-electrode-side busbar and the positive-electrode-side busbar has the second cooling surface.

17. The vehicle drive unit according to claim 8, wherein each power module is disposed closer to an outer peripheral side than the smoothing capacitor, and wherein the busbar is formed with a wide width so as to extend along a peripheral direction of the motor.

18. The vehicle drive unit according to claim 8, wherein an inductance of the busbar is a function of a length extending from the one end portion to the other end portion of the busbar, wherein the function has a minimum value so that the inductance becomes the same at a first length and a second length that differ from each other, wherein the smoothing capacitor and each power module are connected to each other by two of the busbars, the two busbars being a negative-electrode-side busbar and a positive-electrode-side busbar, wherein a length of one of the negative-electrode-side busbar and the positive-electrode-side busbar is the first length, wherein a length of the other of the negative-electrode-side busbar and the positive-electrode-side busbar is the second length, and wherein at least one of the negative-electrode-side busbar and the positive-electrode-side busbar has the second cooling surface.

19. The vehicle drive unit according to claim 9, wherein an inductance of the busbar is a function of a length extending from the one end portion to the other end portion of the busbar, wherein the function has a minimum value so that the inductance becomes the same at a first length and a second length that differ from each other, wherein the smoothing capacitor and each power module are connected to each other by two of the busbars, the two busbars being a negative-electrode-side busbar and a positive-electrode-side busbar, wherein a length of one of the negative-electrode-side busbar and the positive-electrode-side busbar is the first length, wherein a length of the other of the negative-electrode-side busbar and the positive-electrode-side busbar is the second length, and wherein at least one of the negative-electrode-side busbar and the positive-electrode-side busbar has the second cooling surface.

20. The vehicle drive unit according to claim 12, wherein an inductance of the busbar is a function of a length extending from the one end portion to the other end portion of the busbar, wherein the function has a minimum value so that the inductance becomes the same at a first length and a second length that differ from each other, wherein the smoothing capacitor and each power module are connected to each other by two of the busbars, the two busbars being a negative-electrode-side busbar and a positive-electrode-side busbar, wherein a length of one of the negative-electrode-side busbar and the positive-electrode-side busbar is the first length, wherein a length of the other of the negative-electrode-side busbar and the positive-electrode-side busbar is the second length, and wherein at least one of the negative-electrode-side busbar and the positive-electrode-side busbar has the second cooling surface.

* * * * *